(12) United States Patent
Yamazaki et al.

(10) Patent No.: US 7,342,251 B2
(45) Date of Patent: Mar. 11, 2008

(54) METHOD OF MANUFACTURING AN ELECTRO-OPTICAL DEVICE

(75) Inventors: Shunpei Yamazaki, Setagaya (JP); Mayumi Mizukami, Atsugi (JP); Toshimitsu Konuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 354 days.

(21) Appl. No.: 11/202,143

(22) Filed: Aug. 12, 2005

(65) Prior Publication Data

US 2006/0046358 A1    Mar. 2, 2006

Related U.S. Application Data

(62) Division of application No. 10/189,438, filed on Jul. 8, 2002, now Pat. No. 6,958,251, which is a division of application No. 09/598,641, filed on Jun. 21, 2000, now Pat. No. 6,420,200.

(30) Foreign Application Priority Data

Jun. 28, 1999   (JP) ................................. 11-182598

(51) Int. Cl.
*H01L 21/28* (2006.01)

(52) U.S. Cl. .................. 257/59; 257/72; 257/79; 257/91; 257/E33.065; 349/139

(58) Field of Classification Search ............... 257/59, 257/72, 79, 91, E33.065; 349/139, FOR. 129
See application file for complete search history.

(56) References Cited

U.S. PATENT DOCUMENTS

| 4,414,897 A | 11/1983 | Sato et al. |
| 4,418,118 A | 11/1983 | Lindors |
| 4,614,668 A | 9/1986 | Topp et al. |
| 5,055,360 A | 10/1991 | Ogura et al. |
| 5,137,560 A | 8/1992 | Ohmura et al. |
| 5,432,015 A | 7/1995 | Wu et al. |

(Continued)

FOREIGN PATENT DOCUMENTS

CN    1212114    3/1999

(Continued)

OTHER PUBLICATIONS

Michel, B. et al., *Printing Meets Lithography: Soft Approaches to High-Resolution Patterning*, IBM Journal of Research and Development, vol. 48, No. 5, Sep. 5, 2001, pp. 697-719.

(Continued)

*Primary Examiner*—George Fourson
(74) *Attorney, Agent, or Firm*—Eric J. Robinson; Robinson Intellectual Property Law Office, P.C.

(57) ABSTRACT

An object of the invention is to reduce the manufacturing cost of EL display devices and electronic devices incorporating the EL display devices. An EL material is formed by printing in an active matrix EL display device. Relief printing or screen printing may be used as the method of printing. Manufacturing steps of the EL layer is therefore simplified and reduction of manufacturing cost is devised.

17 Claims, 13 Drawing Sheets

U.S. PATENT DOCUMENTS

| | | | |
|---|---|---|---|
| 5,477,783 A | 12/1995 | Hashimura | |
| 5,539,548 A | 7/1996 | Yamazaki et al. | |
| 5,643,685 A | 7/1997 | Torikoshi | |
| 5,643,826 A | 7/1997 | Ohtani et al. | |
| 5,657,139 A | 8/1997 | Hayashi | |
| 5,684,365 A * | 11/1997 | Tang et al. | 315/169.3 |
| 5,807,627 A | 9/1998 | Friend et al. | |
| 5,821,003 A * | 10/1998 | Uemura et al. | 428/690 |
| 5,869,929 A | 2/1999 | Eida et al. | |
| 5,882,761 A | 3/1999 | Kawami et al. | |
| 5,897,187 A | 4/1999 | Aoki et al. | |
| 5,923,962 A | 7/1999 | Ohtani et al. | |
| 5,937,272 A | 8/1999 | Tang | |
| 5,962,962 A * | 10/1999 | Fujita et al. | 313/412 |
| 5,972,419 A | 10/1999 | Roitman | |
| 6,057,647 A | 5/2000 | Kurosawa et al. | |
| 6,118,426 A | 9/2000 | Albert et al. | |
| 6,118,502 A | 9/2000 | Yamazaki et al. | |
| 6,150,668 A | 11/2000 | Bao et al. | |
| 6,166,489 A | 12/2000 | Thompson et al. | |
| 6,174,613 B1 | 1/2001 | Antoniadis et al. | |
| 6,194,837 B1 | 2/2001 | Ozawa | |
| 6,203,391 B1 | 3/2001 | Murasko | |
| 6,204,905 B1 | 3/2001 | Koma et al. | |
| 6,215,244 B1 | 4/2001 | Kuribayashi et al. | |
| 6,284,983 B1 | 9/2001 | Lutschounig et al. | |
| 6,285,042 B1 | 9/2001 | Ohtani et al. | |
| 6,335,541 B1 | 1/2002 | Ohtani et al. | |
| 6,380,672 B1 | 4/2002 | Yudasaka | |
| 6,388,377 B1 | 5/2002 | Kobayashi et al. | |
| 6,403,236 B1 | 6/2002 | Ohnishi et al. | |
| 6,440,877 B1 * | 8/2002 | Yamazaki et al. | 438/780 |
| 6,518,949 B2 | 2/2003 | Drzaic | |
| 6,821,553 B2 | 11/2004 | Miyashita et al. | |
| 6,830,494 B1 * | 12/2004 | Yamazaki et al. | 445/24 |
| 6,833,156 B2 | 12/2004 | Miyashita et al. | |
| 6,838,192 B2 | 1/2005 | Miyashita et al. | |
| 6,863,961 B2 * | 3/2005 | Miyashita et al. | 428/203 |
| 6,943,496 B2 * | 9/2005 | Hishida | 313/512 |
| 6,965,195 B2 * | 11/2005 | Yamazaki et al. | 313/498 |
| 6,998,639 B2 | 2/2006 | Ohtani et al. | |
| 2001/0001050 A1 | 5/2001 | Miyashita et al. | |
| 2002/0041926 A1 | 4/2002 | Miyashita et al. | |
| 2002/0125817 A1* | 9/2002 | Yamazaki et al. | 313/498 |
| 2002/0136823 A1 | 9/2002 | Miyashita et al. | |
| 2002/0155215 A1 | 10/2002 | Miyashita et al. | |
| 2003/0054186 A1 | 3/2003 | Miyashita et al. | |
| 2003/0127650 A1* | 7/2003 | Park et al. | 257/72 |
| 2003/0127652 A1* | 7/2003 | Park et al. | 257/72 |
| 2003/0214231 A1* | 11/2003 | Hishida | 313/506 |
| 2004/0065902 A1 | 4/2004 | Yamazaki et al. | |
| 2004/0147113 A1* | 7/2004 | Yamazaki et al. | 438/660 |
| 2005/0042477 A1* | 2/2005 | Miyashita et al. | 428/690 |
| 2005/0224805 A1* | 10/2005 | Hishida | 257/72 |
| 2006/0028133 A1* | 2/2006 | Kondo et al. | 313/512 |
| 2006/0046358 A1* | 3/2006 | Yamazaki et al. | 438/149 |
| 2006/0077651 A1* | 4/2006 | Yamazaki et al. | 362/84 |
| 2007/0001589 A1* | 1/2007 | Taguchi et al. | 313/504 |
| 2007/0209303 A1* | 9/2007 | Shoda et al. | 52/204.593 |

FOREIGN PATENT DOCUMENTS

| | | |
|---|---|---|
| EP | 0 717 446 | 6/1996 |
| EP | 0 776 147 | 5/1997 |
| EP | 0 781 075 | 6/1997 |
| EP | 0 880 303 | 11/1998 |
| EP | 0 892 028 | 1/1999 |
| EP | 0 901 174 | 3/1999 |
| EP | 0 954 205 | 11/1999 |
| EP | 1 211 916 | 6/2002 |
| EP | 1 376 716 | 1/2004 |
| EP | 1 376 717 | 1/2004 |
| JP | 62-090260 | 4/1987 |
| JP | 03-269995 | 12/1991 |
| JP | 05-031882 | 2/1993 |
| JP | 8-78159 | 3/1996 |
| JP | 08-234683 | 9/1996 |
| JP | 8-330602 | 12/1996 |
| JP | 9-148066 | 6/1997 |
| JP | 10-012377 | 1/1998 |
| JP | 10-077467 | 3/1998 |
| JP | 10-153967 | 6/1998 |
| JP | 10-189252 | 7/1998 |
| JP | 10-189525 | 7/1998 |
| JP | 10-270363 | 10/1998 |
| JP | 11-074082 | 3/1999 |

OTHER PUBLICATIONS

Official Communication dated Dec. 5, 2005 from the European Patent Office for Application Serial No. 00113587.0.

Shimoda et al. "Technology for Active Matrix Light Emitting Polymer Displays," pp. 107-110, Dec. 5-8, 1999, IEDM Technical Digest, Washington, DC.

Shimoda et al., "26.3: Multicolor Pixel Patterning of Light-Emitting Polymers by Ink-Jet Printing," pp. 376-379, May 18-20, 1999, SID International Symposium Digest of Technical Papers, vol. XXX, San Jose, California.

First Office Action, Patent Application No. 00118478.4, Patent Office of the People's Republic of China, Jun. 18, 2004.

European Search Report of EP 00 11 3587, Apr. 5, 2004.

U.S. Appl. No. 09/580,485, including specification, drawings and filing receipt, "Method for Manufacturing an Electro-Optical Device," Shunpei Yamazaki, May 30, 2000.

* cited by examiner

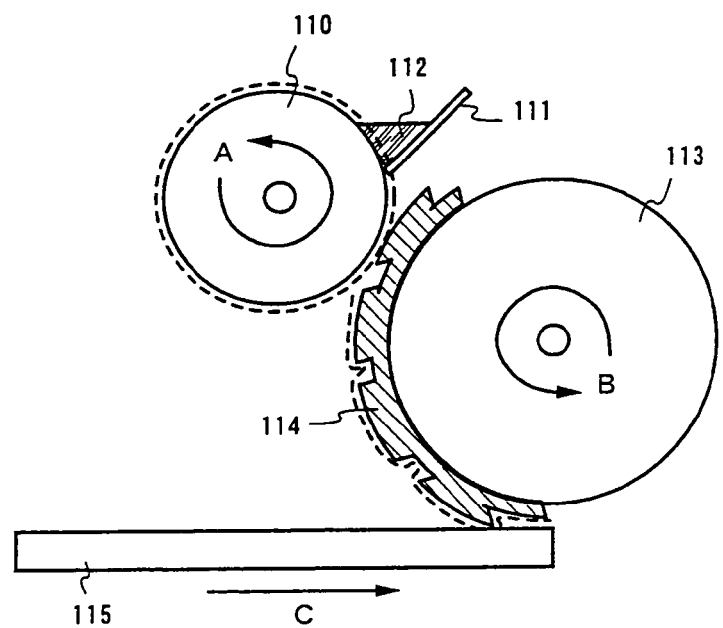
Fig. 1A
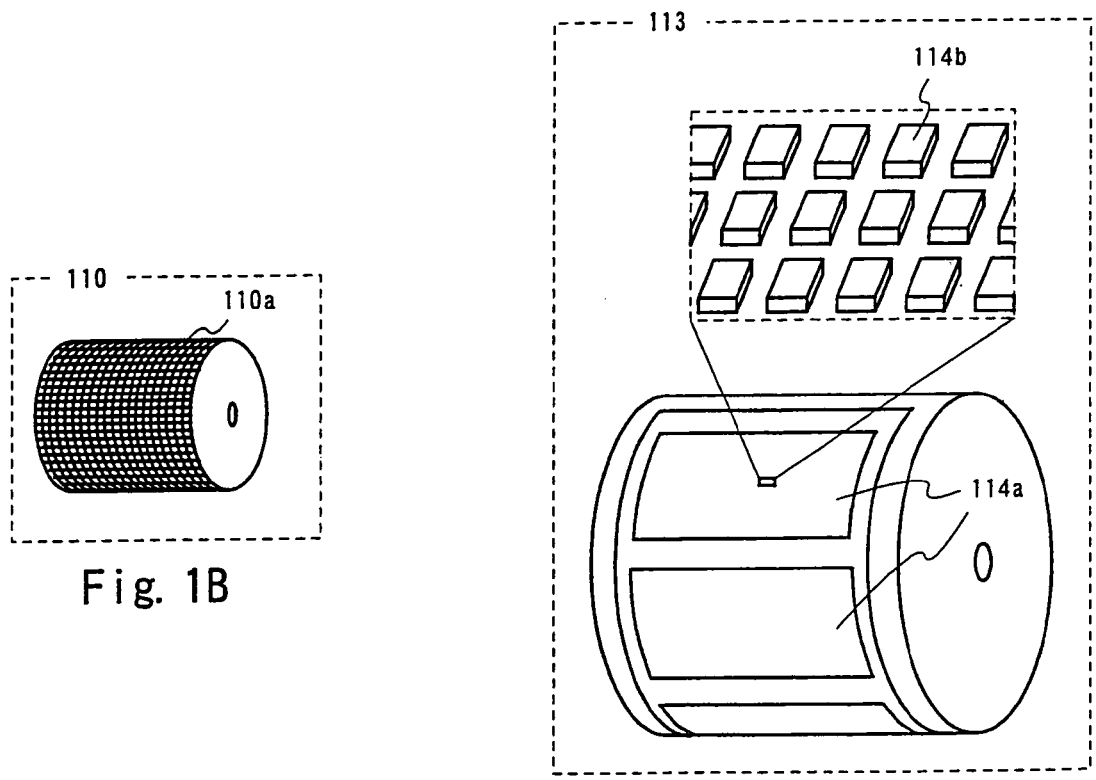
Fig. 1B
Fig. 1C

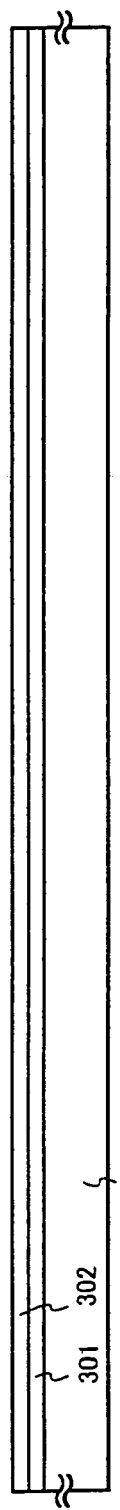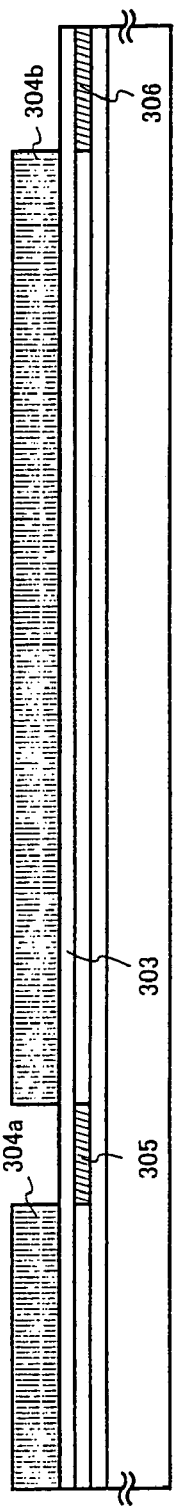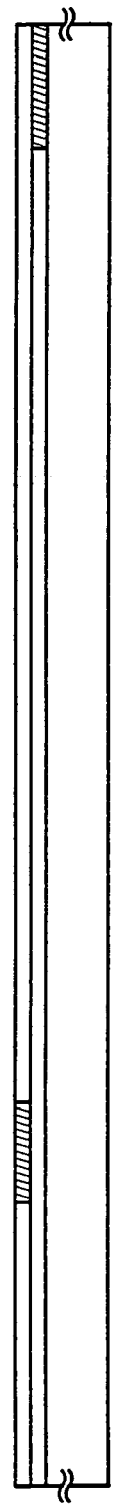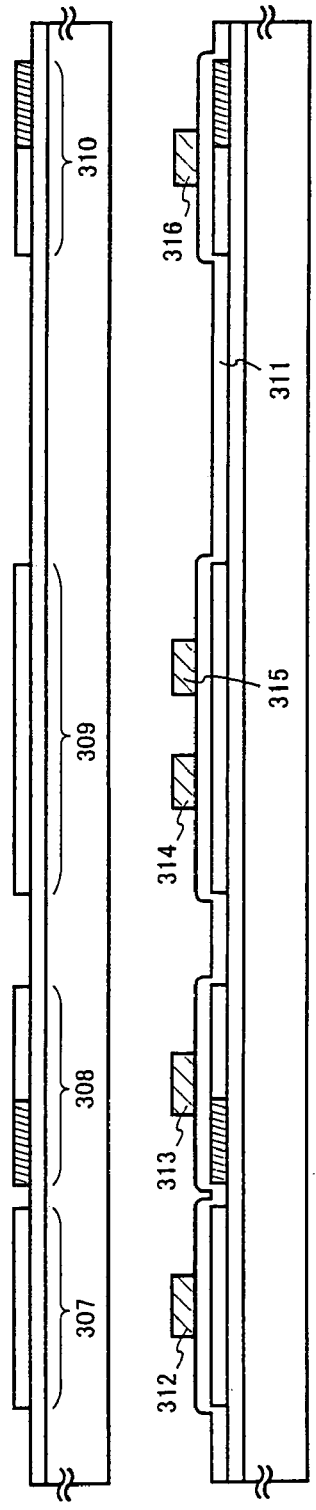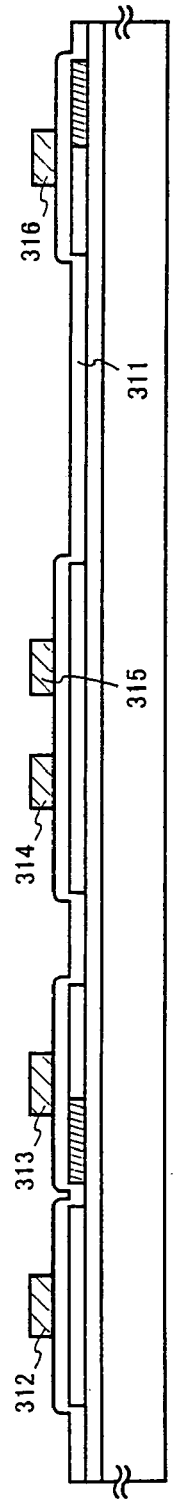

METHOD OF MANUFACTURING AN ELECTRO-OPTICAL DEVICE

BACKGROUND OF THE INVENTION

1. Field of the Invention

The present invention relates to an electro-optical device typified by an EL (electroluminescence) display device formed by fabricating semiconductor elements (elements using a semiconductor thin film, typically thin film transistors) on the surface of a substrate, and an electronic device (electronic equipment) including the electro-optical device as a display. Particularly, the invention relates to a method of manufacturing the same.

2. Description of the Related Art

In recent years, a technique for forming a thin film transistor (hereinafter referred to as a "TFT") on a substrate has made remarkable progress, and its application and development to an active matrix type display device has proceeded. Especially, since a TFT using a polysilicon film has a field effect mobility higher than a conventional TFT using an amorphous silicon film, a high speed operation can be made. Thus, it becomes possible to control a pixel, which has been conventionally controlled by a driving circuit external to a substrate, by a driving circuit formed on the same substrate as the pixel.

Attention has been paid to such an active matrix type display device since various merits, such as reduction of manufacturing cost, miniaturization of a display device, increase of yield, and reduction of throughput, can be obtained by forming various circuits and elements on the same substrate.

In the active matrix type EL display device, a switching element made of a TFT is provided for each pixel, and a driving element for making current control is operated by the switching element, so that an EL layer (light emitting layer) is made to emit light. For example, there is an EL display device disclosed in U.S. Pat. No. 5,684,365 (see Japanese Patent Application Laid-open No. Hei 8-234683), or Japanese Patent Application Laid-open Publication No. Hei 10-189252.

As a method of forming the EL layer, various methods have been proposed. For example, there can be enumerated vacuum evaporation, sputtering, spin coating, roll coating, a cast method, LB method, ion plating, a dipping method, an inkjet method, and the like.

SUMMARY OF THE INVENTION

An object of the present invention is to reduce a manufacturing cost of an EL layer and to provide an inexpensive EL display device. Another object of the invention is to reduce a product cost of an electronic device (electronic equipment) including the EL display device as a display.

In order to achieve the foregoing objects, the present invention is characterized in that an EL layer is formed by printing. A relief printing or a screen printing can be used as the printing method, and a relief printing is specifically preferable. The case of using a relief printing in the present invention is described here by using FIG. 1.

Shown in FIGS. 1A to 1C are a part of a relief printing apparatus used in the present invention. In FIGS. 1A to 1C, reference numeral 110 denotes an anilox roll; 111, a doctor bar (also referred to as a doctor blade); mixture of an EL element and a solvent (hereinafter referred to as EL forming substance) 112 is pooled at around the surface of the anilox roll 110 by the doctor bar 111. Note that the EL material referred here is a fluorescent organic compound and denotes an organic compound which is referred to a hole injection layer, a hole transport layer, a light emitting layer, an electron transport layer or an electron injection layer in general.

Meshed grooves (hereinafter referred to as mesh) 110a are provided on the surface of the anilox roll 110 as shown in FIG. 1B, and the mesh 110a holds the EL forming substance 112 on its surface by rolling in a direction of arrow A. Note that the dotted line shown in the figure means that the EL forming substance is held on the surface of the anilox roll 110.

Reference numeral 113 is a printing roll and 114, a relief, and unevenness is formed on the surface of the relief 114 by etching, etc. Such state is shown in FIG. 1C. In the case of FIG. 1C, patterns for the pixel section 114a are formed in plural parts on the relief 114 in order to manufacture a plurality of EL display devices over one substrate. Further, projections 114b are formed at positions corresponding to a plurality of pixels when a pattern for the pixel section 114a is enlarged.

The above stated anilox roll 110 keeps the EL forming substance 112 on the mesh 110a by rolling. On the other hand, the printing roll 113 turns in a direction of an arrow B and only the projections 114b of the relief 114 contact the mesh 110a. Here, EL forming substance 112 is coated on the surface of the projections 114b.

EL forming substance 112 is printed at the sections where the projections 114b and a substrate 115 that is shifted in horizontal direction (direction of an arrow C) at the same speed as the printing roll 113 contacts. By doing so, EL forming substance 112 is printed on the substrate 115 in a state of arrangement into a matrix.

EL material is then resided by evaporating the solvent included in the EL forming substance 112 through heat treatment in a vacuum. It is therefore necessary to use a solvent that evaporates at a lower temperature than the glass transition temperature (Tg) of the EL material. The thickness of the finally formed EL layer is determined by the viscosity of the EL forming substance. In this case the velocity can be controlled by selection of the solvent, and the velocity of 10 to 50 cp (preferably 20 to 30 cp) is preferable.

Further, the possibility of crystallizing the EL material through evaporation of solvent becomes high when much impurities that can be a crystalline nucleus exist in the EL forming substance 112. The crystallization reduces the light emitting efficiency and thus it is not preferable. It is preferable that least possible impurity is contained in the EL forming substance 112.

It is important to make the environment clean as possible, at refining the solvent, refining the EL material or mixing the solvent and the EL material for reducing the impurities, and it is also preferable to pay attention to the atmosphere on printing the EL forming substance by the printing apparatus of FIG. 1. In concrete, it is preferable to perform the above stated printing process of the EL forming substance by a printing apparatus placed in a clean booth filled with an inert gas such as nitrogen.

Note that the present invention can be implemented to both of an active matrix EL display device and a passive matrix (simple matrix) EL display device.

BRIEF DESCRIPTION OF THE DRAWINGS

In the accompanying drawings:

FIGS. 1A to 1C are diagrams for explaining the principle of a relief printing method;

FIGS. 4A to 4E are diagrams showing manufacturing steps of an active matrix type EL display device;

DETAILED DESCRIPTION OF THE INVENTION

[Embodiment Mode]

Figure 2:
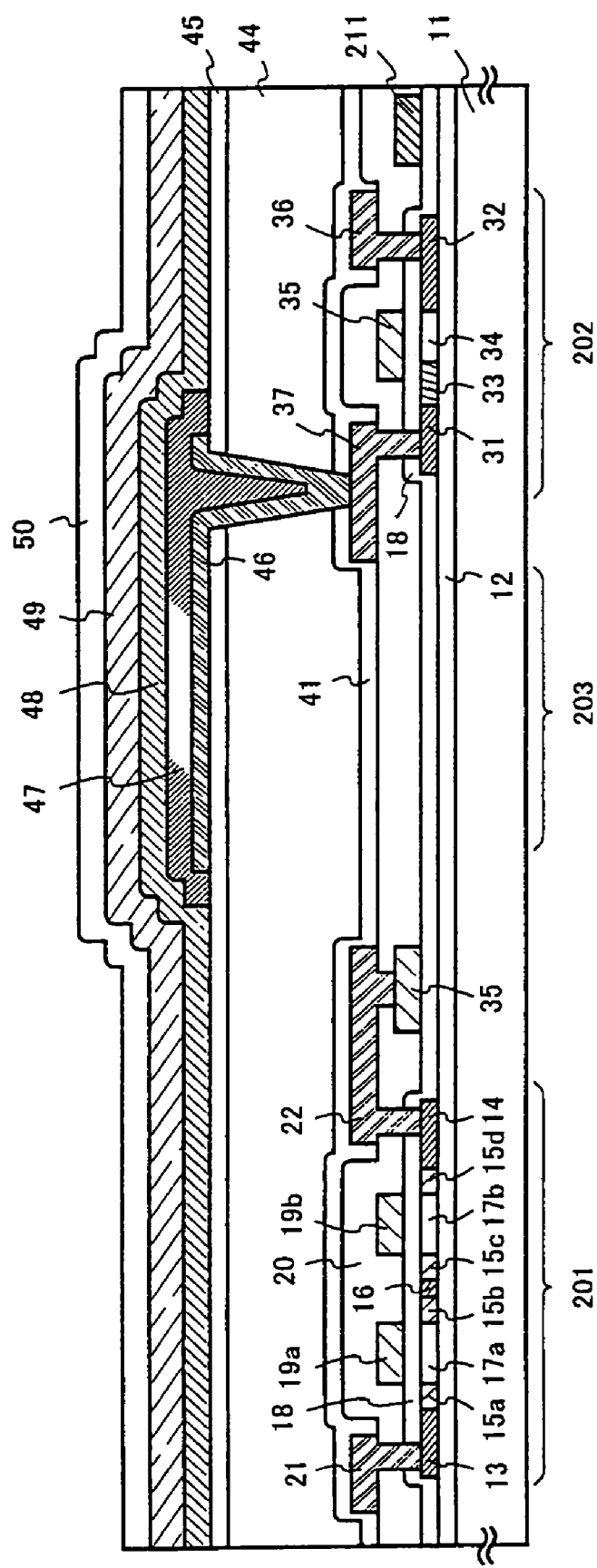
FIG. 2 is a diagram showing a sectional structure of a pixel portion of an EL display device.
Figure 3A:
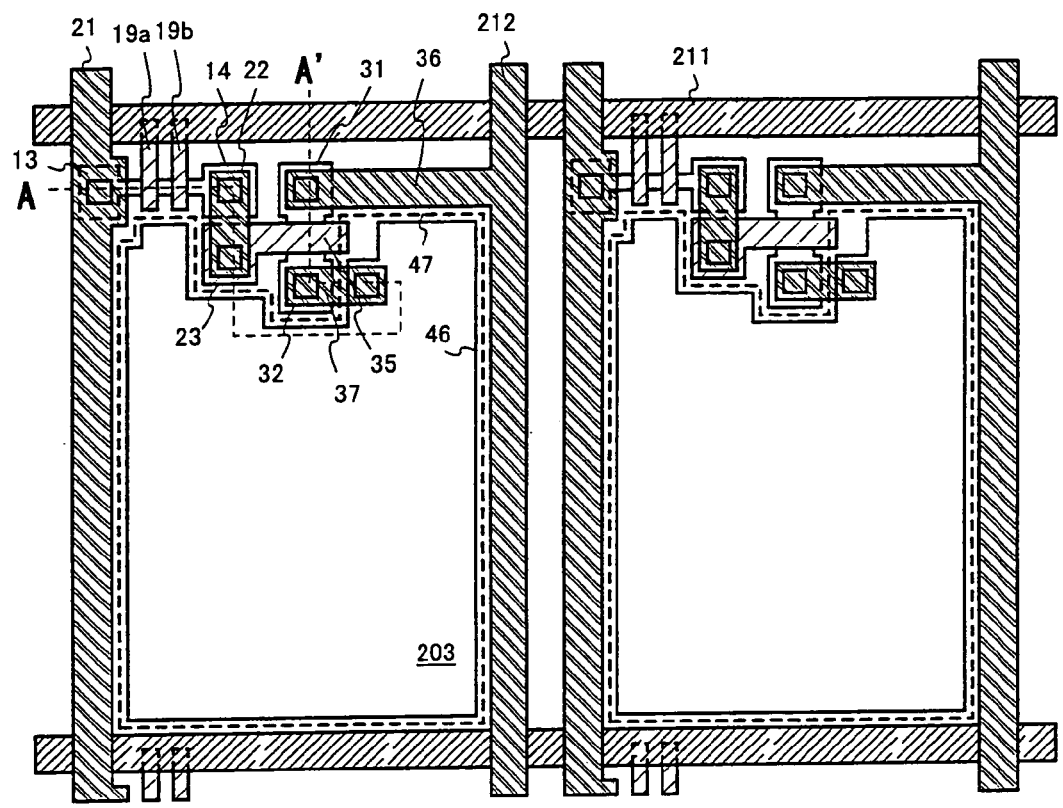
FIGS. 3A and 3B are diagrams showing a top view of a pixel portion of an EL display device and a circuit structure thereof.
Figure 3B:
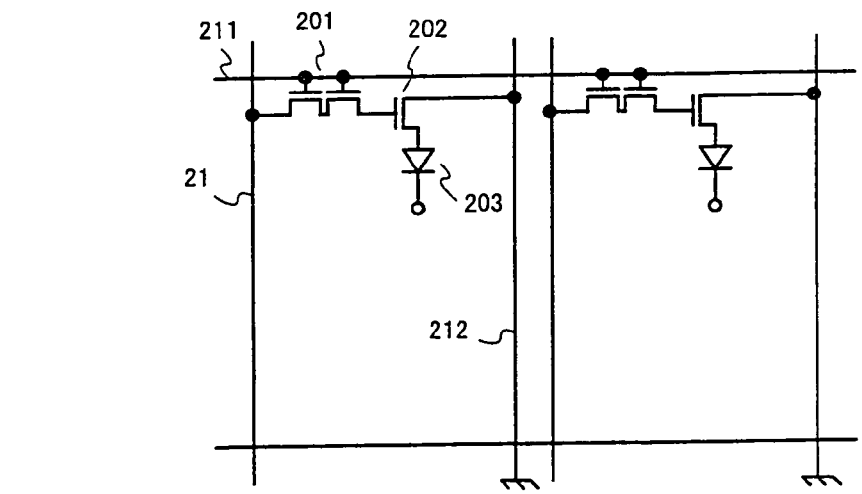

A mode for carrying out the present invention will next be described with reference to FIG. 2 and FIGS. 3A and 3B. FIG. 2 is a sectional view of a pixel portion of an EL display device of the present invention, FIG. 3A is a top view thereof, and FIG. 3B is a view showing its circuit structure. A plurality of pixels are arranged in matrix form in practice so that a pixel portion (image display portion) is formed. Note that FIG. 2 corresponds to a sectional view taken along line A-A' of FIG. 3A. Thus, since common symbols are used in FIG. 2 and FIG. 3A, both drawings may be suitably referred. Besides, although the top view of FIG. 3 shows two pixels, both have the same structure.

In FIG. 2, a reference numeral 11 designates a substrate; and 12, an insulating film (hereinafter referred to as a base film) which becomes an undercoat. A glass substrate, a glass ceramic substrate, a quartz substrate, a silicon substrate, a ceramic substrate, a metal substrate, or a plastic substrate (including a plastic film as well) can be used as the substrate 11.

Although the base film 12 is effective especially in the case of using the substrate containing a movable ion or the substrate having conductivity, it is not necessarily provided on the quartz substrate. As the base film 12, an insulating film containing silicon may be used. Note that through the specification, the "insulating film containing silicon" indicates an insulating film containing silicon, oxygen and nitrogen at a predetermined ratio, for example, a silicon oxide film, a silicon nitride film, or a silicon oxynitride film (indicated by SiOxNy).

It is effective to dissipate heat generation of the thin film transistor (hereinafter referred to as TFT) by making the base film 12 have a heat radiating effect in order to prevent deterioration of a TFT or deterioration of an EL element. For the purpose of making the film have the heat radiating effect, any well-known materials can be used.

Here, two TFTs are formed in the pixel. A reference numeral 201 designates a TFT (hereinafter referred to as a switching TFT) functioning as a switching element; and 202, a TFT (hereinafter referred to as a current controlling TFT) functioning as a current controlling element for controlling the amount of current flowing to the EL element. Both are formed out of an n-channel TFT.

Since the field effect mobility of an n-channel TFT is larger than the field effect mobility of a p-channel TFT, its operation speed is high and a large current can be easily made to flow. When the same amount of current is made to flow, the TFT size of the n-channel TFT can be made smaller. Thus, it is preferable to use the n-channel TFT as the current controlling TFT since an effective area of a display portion becomes wide.

The p-channel TFT has merits that hot carrier injection hardly becomes a problem and an off current value is low, and there have been reported an example in which it is used as a switching TFT and an example in which it is used as a current controlling TFT. However, the present invention is characterized also in that, by making such a structure that the positions of LDD regions are made different, the problems of the hot carrier injection and the off current value are solved even in the n-channel TFT, and all the TFTs in the pixel are made the n-channel TFTs.

However, it is not necessary to limit the switching TFT and the current controlling TFT to the n-channel TFT in the present invention, and it is possible to use a p-channel TFT for both or either one of them.

The switching TFT 201 includes a source region 13, a drain region 14, LDD regions 15a to 15d, an active layer including a high concentration impurity region 16 and channel formation regions 17a and 17b, a gate insulating film 18, gate electrodes 19a and 19b, a first interlayer insulating film 20, a source wiring line 21, and a drain wiring line 22.

Besides, as shown in FIG. 3A, the gate electrodes 19a and 19b are of a double gate structure in which they are electrically connected through a gate wiring line 211 formed of another material (material having resistance lower than the gate electrodes 19a and 19b). Of course, in addition to the double gate structure, a so-called multi-gate structure (structure including an active layer having two or more channel formation regions connected in series), such as a triple gate structure, etc., may be adopted. The multi-gate structure is extremely effective in reducing the off current value, and in the present invention, the switching TFT 201 of the pixel is made the multi-gate structure so that the switching element having a low off current value is realized.

The active layer is formed out of a semiconductor film containing a crystal structure. That is, a single crystal semiconductor film may be used or a polycrystalline semiconductor film or microcrystalline semiconductor film may be used. The gate insulating film 18 may be formed out of an insulating film containing silicon. Besides, any conductive films can be used for the gate electrode, source wiring line, or drain wiring line.

Further, in the switching TFT 201, the LDD regions 15a to 15d are provided not to overlap with the gate electrodes 19a and 19b, with the gate insulating film 18 put between the LDD regions and the gate electrodes. Such structure is very effective in reducing the off current value.

Incidentally, it is more desirable to provide an offset region (region which is made of a semiconductor layer having the same composition as the channel formation region and to which a gate voltage is not applied) between the channel formation region and the LDD region in order to reduce the off current. In the case of multi-gate structure having two or more gate electrodes, a high concentration impurity region provided between the channel formation regions is effective in reducing the off current value.

As described above, by using the TFT of the multi-gate structure as the switching element 201 of the pixel, it is possible to realize the switching element having a sufficiently low off current value. Thus, even if a capacitor as shown in FIG. 2 of Japanese Patent Application Laid-open No. Hei 10-189252 is not provided, the gate voltage of the current controlling TFT can be held for a sufficient time (an interval between a selection and a next selection).

That is, it becomes possible to remove a capacitor which has conventionally been a factor to narrow an effective light emitting area, and it becomes possible to widen the effective light emitting area. This means that the picture quality of the EL display device can be made bright.

Next, the current controlling TFT 202 comprises a source region 31, a drain region 32, an active layer including an LDD region 33 and a channel formation region 34, a gate insulating film 18, a gate electrode 35, the first interlayer insulating film 20, a source wiring line 36, and a drain wiring line 37. Although the gate electrode 35 is of a single gate structure, a multi-gate structure may be adopted.

As shown in FIG. 2, the drain of the switching TFT is connected to the gate of the current controlling TFT. Specifically, the gate electrode 35 of the current controlling TFT 202 is electrically connected to the drain region 14 of the switching TFT 201 through the drain wiring line (may be called a connection wiring line) 22. The source wiring line 36 is connected to a current supply line 212.

Although the current controlling TFT 202 is an element for controlling the amount of current injected to an EL element 203, in view of deterioration of the EL element, it is not preferable to supply a large amount of current. Thus, in order to prevent an excessive current from flowing to the current controlling TFT 202, it is preferable to design the channel length (L) to be rather long. Desirably, it is designed so that the current becomes 0.5 to 2 µA (preferably 1 to 1.5 µA) per pixel.

Figure 9:
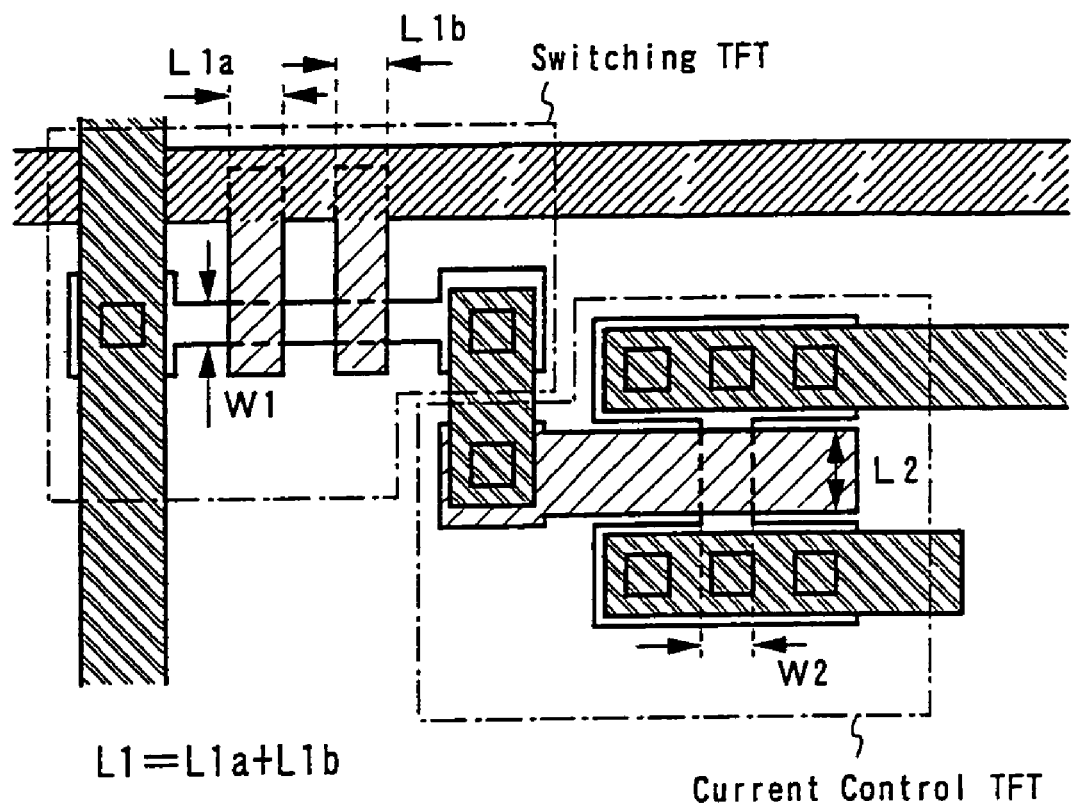
FIG. 9 is an enlarged view of a pixel portion of an EL display device.

In view of the above, as shown in FIG. 9, when the channel length of the switching TFT is L1 (L1=L1$a$+L1$b$), the channel width is W1, the channel length of the current controlling TFT is L2, and the channel width is W2, it is preferable that W1 is made between 0.1 and 5 µm (typically 0.5 to 2 µm), and W2 is made between 0.5 and 10 µm (typically 2 to 5 µm). Besides, it is preferable that L1 is made 0.2 to 18 µm (typically 2 to 15 µm), and L2 is made 1 to 50 µm (typically 10 to 30 µm). However, the present invention is not limited to the above numerical values.

By selecting the range of these numerical values, all standards can be covered, from an EL display device having the pixel number of VGA class (640×480) to that of high vision class (1920×1080 or 1280×1024).

Besides, it is appropriate that the length (width) of the LDD region formed in the switching TFT 201 is made 0.5 to 3.5 µm, typically 2.0 to 2.5 µm.

Besides, the EL display device shown in FIG. 2 is characterized also in that the LDD region 33 is provided between the drain region 32 and the channel formation region 34, and the LDD region 33 includes a region overlapping with and a region not overlapping with the gate electrode 35, with the gate insulating film 18 put between them, in the current controlling TFT 202.

The current controlling TFT 202 supplies current for causing the EL element 204 to emit light, and controls the supply amount to enable gray scale display. Thus, it is necessary to take a countermeasure against deterioration due to the hot carrier injection so that deterioration does not occur even if current is supplied. When black is displayed, although the current controlling TFT 202 is turned off, at that time, if an off current is high, clear black display becomes impossible, and the lowering of contrast or the like is caused. Thus, it is necessary to suppress the off current value as well.

With respect to the deterioration due to the hot carrier injection, it is known that the structure where the LDD region overlaps with the gate electrode is very effective. However, if the whole of the LDD region is made to overlap with the gate electrode, the off current value is increased. Thus, the present applicant contrives a new structure that the LDD region not overlapping with the gate electrode is provided in series, so that the problems of the hot carrier countermeasure and the off current value countermeasure are solved at the same time.

At this time, it is appropriate that the length of the LDD region overlapping with the gate electrode is made 0.1 to 3 µm (preferably 0.3 to 1.5 µm). If the length is too long, parasitic capacity becomes large, and if too short, the effect of preventing the hot carrier becomes weak. Besides, it is appropriate that the length of the LDD region not overlapping with the gate electrode is made 1.0 to 3.5 µm (preferably 1.5 to 2.0 µm). If the length is too long, it becomes impossible to make a sufficient current flow, and if too short, the effect of lowering the off current value becomes weak.

In the above structure, parasitic capacity is formed in the region where the gate electrode and the LDD region overlap with each other. Thus, it is preferable not to provide such region between the source region 31 and the channel formation region 34. In the current controlling TFT, since the direction of flow of carriers (here, electrons) is always the same, it is sufficient if the LDD region is provided at only the side of the drain region.

However, when the driving voltage of the current controlling TFT 202 (voltage applied between the source region and the drain region) becomes 10 V or less, the hot carrier injection hardly becomes problematic, so that it is also possible to omit the LDD region 33. In that case, the active layer is made of the source region 31, the drain region 32, and the channel formation region 34.

From the viewpoint of increasing the amount of current which can be made to flow, it is also effective to increase the film thickness (preferably 50 to 100 nm, more preferably 60 to 80 nm) of the active layer (especially the channel formation region) of the current controlling TFT 202. On the contrary, in the case of the switching TFT 201, from the viewpoint of decreasing the off current value, it is also effective to decease the film thickness (preferably 20 to 50 nm, more preferably 25 to 40 nm) of the active layer (especially the channel formation region).

Next, a reference numeral 41 designates a first passivation film, and it is appropriate that the thickness is made 10 nm to 1 µm (preferably 200 to 500 nm). As the material, it is possible to use an insulating film containing silicon (especially a silicon oxynitride film or silicon nitride film is preferable). This passivation film 41 has a function of protecting the formed TFT against alkali metal or moisture. In the EL layer finally provided above the TFT, alkali metal such as sodium is contained. That is, the first passivation film 41 functions also as a protecting film which prevents the alkali metal (movable ion) from entering the TFT side.

It is also effective to prevent thermal deterioration of the EL layer by causing the first passivation film 41 to have a heat radiating effect. However, in the EL display device of the structure of FIG. 2, since light is radiated to the side of the substrate 11, it is necessary that the first passivation film 41 is translucent. In the case where organic material is used for the EL layer, since deterioration is caused by combination with oxygen, it is desirable not to use an insulating film which easily emits oxygen.

As a translucent material which prevents penetration of alkali metal and has a heat radiating effect, there can be cited an insulating film containing at least one element selected from B (boron), C (carbon) and N (nitrogen), and at least one element selected from Al (aluminum), Si (silicon) and P (phosphorus). For example, it is possible to use a nitride of aluminum typified by aluminum nitride (AlxNy), carbide of silicon typified by silicon carbide (SixCy), nitride of silicon typified by silicon nitride (SixNy), nitride of boron typified by boron nitride (BxNy), or phosphide of boron typified by boron phosphide (BxPy). An oxide of aluminum typified by aluminum oxide (AlxOy) is excellent in transparency, and its thermal conductivity is 20 $Wm^{-1}K$, so that it can be said one of preferable materials. These materials have not only the foregoing effects but also an effect to prevent penetration of moisture. Incidentally, in the foregoing translucent materials, x and y are arbitrary integers.

Note that it is also possible to combine the above compound with another element. For example, it is also possible to use aluminum nitride oxide indicated by AlNxOy by adding nitrogen to the aluminum oxide. This material also has the effect to prevent penetration of moisture or alkali metal in addition to the heat radiating effect. Incidentally, in the above aluminum nitride oxide, x and y are arbitrary integers.

Besides, it is possible to use materials disclosed in Japanese Patent Application Laid-open No. Sho 62-90260. That is, it is also possible to use an insulating film containing Si, Al, N, O, or M (M is at least one kind of rare-earth element, preferably at least one element selected from Ce (cerium), Yb (ytterbium), Sm (samarium), Er (erbium), Y (yttrium), La (lantern), Gd (gadolinium), Dy (dysprosium), and Nd (neodymium)). These materials also have the effect to prevent penetration of moisture or alkali metal in addition to the heat radiating effect.

Besides, it is also possible to use a carbon film containing at least a diamond thin film or an amorphous carbon film (especially a film having characteristics close to diamond, called diamond-like carbon or the like). These have very high thermal conductivity and are very effective as a heat radiating layer. However, since the film becomes brown and its transmissivity is decreased when the thickness becomes large, it is preferable to use the film having the least possible thickness (preferably 5 to 100 nm).

Incidentally, since the primary object of the first passivation film 41 is to protect the TFT against the alkali metal or moisture, the film must not spoil the effect. Thus, although a thin film made of the material having the foregoing heat radiating effect can be used alone, it is effective to laminate the thin film and an insulating film (typically a silicon nitride film (SixNy) or silicon oxynitride film (SiOxNy)) which can prevent penetration of alkali metal or moisture. Incidentally, in the silicon nitride film or silicon oxynitride film, x and y are arbitrary integers.

A second interlayer insulating film (may be called a planarization film) 44 is formed on the first passivation film 41 so as to cover the respective TFTs, so that step formed by TFTs are flattened. As the second interlayer insulating film 44, an organic resin film is preferable, and it is appropriate that polyimide, polyamide, acrylic, BCB (benzocyclobutene), or the like is used. Of course, as long as sufficient flattening can be made, an inorganic film may be used.

It is very important to flatten the step due to the TFTs by the second interlayer insulating film 44. Since an EL layer formed later is very thin, there is a case where poor light emission occurs by the existence of the step. Thus, it is preferable to make flattening before a pixel electrode is formed so that the EL layer can be formed on the flattest possible surface.

A reference numeral 45 designates a second passivation film and has a very important function of blocking the alkali metal diffusing from the EL element. It is appropriate that the film thickness is made 5 nm to 1 µm (typically 20 to 300 nm). An insulating film capable of blocking the penetration of the alkali metal is used as the second passivation film 45. As a material, the material used for the first passivation film 41 can be used.

The second passivation film 45 functions also as a heat radiating layer which dissipates heat generated in the EL element and serves to prevent heat from being stored in the EL element. In the case where the second interlayer insulating film 44 is an organic resin film, since it is weak to heat, the second passivation film prevents the heat generated in the EL element from having a bad influence on the second interlayer insulating film 44.

As described above, although it is effective to flatten the TFTs with the organic resin film when the EL display device is manufactured, there has been no conventional structure in which consideration is paid to the deterioration of the organic resin film caused by heat generated in the EL element. In the present invention, the problem is solved by providing the second passivation film 45, which can be said one of the features.

The second passivation film 45 prevents the deterioration due to heat and also functions as a protecting film to prevent the alkali metal in the EL layer from diffusing to the side of the TFT, and further, also functions as a protecting layer to prevent moisture or oxygen from penetrating from the side of the TFT to the side of the EL layer.

As stated above, separation of TFT side and EL element side by an insulating film that has a high heat radiating effect and that is capable of preventing penetration of moisture and alkali metals, is one of the most important characteristics of the present invention, and it can be said that such constitution did not exist in conventional EL display devices.

A reference numeral 46 designates a pixel electrode (anode of the EL element) made of a transparent conductive film. After a contact hole (opening) is formed through the second passivation film 45, the second interlayer insulating film 44, and the first passivation film 41, the pixel electrode is formed to be connected with the drain wiring line 37 of the current controlling TFT 202 at the formed opening portion.

Next, an EL layer (strictly, an EL layer being in contact with the pixel electrode) 47 is formed by printing. Although the EL layer 47 is used as a single layer structure or laminate structure, it is used as the laminate structure in many cases. However, in the case of lamination, it is preferable to combine the printing and vapor phase growth (especially, an evaporation method is preferable). In the printing method, since a solvent and an EL material are mixed and are printed, if an organic material is included underneath, there is a fear that the organic material dissolves again.

Thus, it is preferable that a layer coming in direct contact with the pixel electrode within the EL layer 47 is formed by the printing, and layer thereafter is formed by the vapor phase growth. Needless to say, if printing can be made by using such solvent that the EL material, of the lower layer does not dissolve, all layers can be formed by the printing. A hole injecting layer, a hole transporting layer, or a light emitting layer can be given as a layer coming in direct contact with the pixel electrode, the present invention can be used in a case of forming any layer.

In the present invention, since the printing is used as the method of forming the EL layer, it is preferable to use a polymer material as the EL material. As typical polymer materials, polymer materials such as polyparaphenylene vinylene (PPV), polyvinylcarbazole (PVK) or polyfluorene, can be enumerated.

In order to form the hole injecting layer, hole transporting layer, or light emitting layer made of the polymer material by printing, printing is made in the state of a polymer precursor, and it is heated in a vacuum and is converted into the EL material made of the polymer material. A necessary EL material is laminated thereon by the evaporation method or the like, so that the laminate type EL layer is formed.

Specifically, as the hole transporting layer, it is preferable that polytetrahydrothiophenylphenylene as the polymer precursor is used and is converted to polyphenylene vinylene by heating. It is appropriate that the film thickness is made 30 to 100 nm (preferably 40 to 80 nm). As the light emitting layer, it is preferable that cyanopolyphenylene vinylene is used for a red light emitting layer, polyphenylene vinylene is used for a green light emitting layer, and polyphenylene vinylene or polyalkylphenylene is used for a blue light emitting layer. It is appropriate that the film thickness is made 30 to 150 nm (preferably 40 to 100 nm).

It is also effective to provide copper phthalocyanine as a buffer layer between the pixel electrode and the EL material formed thereon.

However, the above examples are merely examples of organic EL materials which can be used as the EL materials of the present invention, and it is not necessary to limit the invention to these. In the present invention, a mixture of an EL material and a solvent is printed, and the solvent is vaporized and removed, so that the EL layer is formed. Thus, as long as the combination is such that vaporization of the solvent is carried out at a temperature not exceeding the glass transition temperature of the EL layer, any EL material may be used.

Typically, as the solvent, an organic solvent such as chloroform, dichloromethane, γ-butyl lactone, butyl cellosolve, or NMP (N-methyl-2-pyrolidone) may be used, or water may be used. It is also effective to add an additive for increasing the viscosity of the EL forming material.

Besides, when the EL layer 47 is formed, it is preferable that a treatment atmosphere is made a dry atmosphere with the least possible moisture and formation is carried out in an inert gas. Since the EL layer is easily deteriorated by the existence of moisture or oxygen, when the layer is formed, it is necessary to remove such factors to the utmost. For example, a dry nitrogen atmosphere or dry argon atmosphere is preferable. For that purpose, it is desirable that the printing apparatus is set in a clean booth filled with an inert gas, and the printing treatment is carried out in the atmosphere.

When the EL layer 47 is formed by printing as described above, next, a cathode 48 and a protecting electrode 49 are formed. The cathode 48 and the protecting electrode 49 may be formed by a vacuum evaporation method. If the cathode 48 and the protecting electrode 49 are continuously formed without opening to the air, deterioration of the EL layer can be further suppressed. In the present specification, a light emitting element formed out of the pixel electrode (anode), the EL layer and the cathode is called the EL element.

As the cathode 48, a material containing magnesium (Mg), lithium (Li), or calcium (Ca) having a low work function is used. Preferably, an electrode made of MgAg (material of Mg and Ag mixed at a ratio of Mg:Ag=10:1) is used. In addition, a MgAgAl electrode, a LiAl electrode, and a LiFAl electrode can be enumerated. The protective electrode 49 is an electrode, which is provided to protect the cathode 48 from outside moisture or the like, and a material containing aluminum (Al) or silver (Ag) is used. This protective electrode 49 has also a heat radiation effect.

Incidentally, it is preferable that the EL layer 47 and the cathode 48 are continuously formed in a dry inert gas atmosphere without opening to the air. In the case where an organic material is used for the EL layer, since it is very weak to moisture, this way is adopted to avoid moisture absorption at the time of opening to the air. Further, it is more desirable to continuously form not only the EL layer 47 and the cathode 48 but also the protective electrode 49 thereon.

The structure of FIG. 2 is an example of a case of using a monochromatic light emitting system where one kind of EL element corresponding to any one of RGB is formed. Although FIG. 2 shows only one pixel, a plurality of pixels having the same structure are arranged in matrix form in the pixel portion. Incidentally, a well-known material may be adopted for the EL layer corresponding to any one of RGB.

In addition to the above system, color display can be made by using a system in which an EL element of white light emission and a color filter are combined, a system in which an EL element of blue or blue-green light emission and a fluorescent material (fluorescent color converting layer: CCM) are combined, a system in which a transparent electrode is used as a cathode (counter electrode) and EL elements corresponding to RGB are stacked, or the like. Of course, it is also possible to make black-and-white display by forming an EL layer of white light emission in a single layer.

Reference numeral 50 designates a third passivation film, and it is appropriate that its film thickness is made 10 nm to 1 μm (preferably 200 to 500 nm). Although a main object of providing the third passivation film 50 is to protect the EL layer 47 from moisture, a heat radiation effect may also be provided, similarly to the second passivation film 45. Accordingly, a similar material to the first passivation film 41 can be used as a forming material. However, in the case where an organic material is used for the EL layer 47, because the layer may possibly be deteriorated through combination with oxygen, it is desirable not to use an insulating film, which is apt to give off oxygen.

Besides, as described above, since the EL layer is weak to heat, it is desirable to form a film at the lowest possible temperature (preferably in a temperature range of from room temperature to 120° C.). Thus, it can be said that plasma CVD, sputtering, vacuum evaporation, ion plating, or a solution application method (spin coating method) is a preferable film forming method.

Like this, although the deterioration of the EL element can be sufficiently suppressed by merely providing the second passivation film 45, preferably, the EL element is surrounded by two-layer insulating films formed to be put at both sides of the EL element, such as the second passivation film 45 and the third passivation film 50, so that intrusion of moisture and oxygen into the EL layer is prevented, diffusion of alkaline metal from the EL layer is prevented, and storage of heat into the EL layer is prevented. As a result, deterioration of the EL layer is further suppressed, and an EL display device having high reliability can be obtained.

The EL display device of the present invention includes a pixel portion made of a pixel having a structure as in FIG. 2, and TFTs having different structures according to functions are disposed in the pixel. Accordingly, a switching TFT having a sufficiently low off current value and a current controlling TFT strong against hot carrier injection can be formed within the same pixel, and an EL display device having high reliability and enabling excellent picture display (having high operation performance) can be obtained.

Note that in the pixel structure of FIG. 2, although a TFT having a multi-gate structure is used as the switching TFT, it is not necessary to limit a structure of arrangement of LDD regions or the like to the structure of FIG. 2.

Further, though an example of implementing the present invention in forming an EL element that is electrically connected to a TFT provided as a semiconductor device on a substrate surface is shown here, it is also possible to implement the present invention in the case of using transistors formed on a silicon substrate surface (referred to as MOSFET) as semiconductor devices.

The present invention manufactured through the foregoing constituents will be described in more detail with reference to embodiments described below.

Embodiment 1

The embodiments of the present invention are explained using FIGS. 4A to 6C. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits.

First, as shown in FIG. 4A, a base film 301 is formed with a 300 nm thickness on a glass substrate 300. Silicon oxynitride films are laminated as the base film 301 in embodiment 1. It is good to set the nitrogen concentration at between 10 and 25 wt % in the film contacting the glass substrate 300.

Besides, as a part of the base film 301, it is effective to provide an insulating film made of a material similar to the first passivation film 41 shown in FIG. 2. The current controlling TFT is apt to generate heat since a large current is made to flow, and it is effective to provide an insulating film having a heat radiating effect at a place as close as possible.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. However, in order to increase an aperture ratio of a pixel by making an area of the current controlling TFT as small as possible, it is advantageous to use the crystalline silicon film through which a current can easily flow.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 4B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used provided that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added through the protecting film 303. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1\times10^{18}$ atoms/cm$^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2\times10^{16}$ to $5\times10^{19}$ atoms/cm$^3$ (typically between $5\times10^{17}$ and $5\times10^{18}$ atoms/cm$^3$).

Next, as shown in FIG. 4C, the protecting film 303 is removed, and an activation of the added periodic table group 15 elements is performed. A known technique of activation may be used as the means of activation, and activation is performed in embodiment 1 by irradiation of excimer laser light. A pulse emission type excimer laser is and a continuous emission type excimer laser may both, of course, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protecting film 303 in place. The activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with regions along the edges of the n-type impurity regions 305 and 306, namely regions along the perimeter into which the n-type impurity element, which exists in the n-type impurity regions 305 and 306, is not added, is defined by this process. This means that, at the point when the TFTs are later completed, extremely good connections can be formed between LDD regions and channel forming regions.

Unnecessary portions of the crystalline silicon film are removed next, as shown in FIG. 4D, and island shape semiconductor films (hereafter referred to as active layers) 307 to 310 are formed.

Then, as shown in FIG. 4E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon oxynitride film is used in embodiment 1.

A conducting film with a thickness of 200 to 400 nm is formed next and patterned, forming gate electrodes 312 to 316. Note that in embodiment 1, the gate electrodes and lead wirings electrically connected to the gate electrodes (hereafter referred to as gate wirings) are formed from different materials. Specifically, a material having a lower resistance than that of the gate electrodes is used for the gate wirings. This is because a material which is capable of being micro-processed is used as the gate electrodes, and even if the gate wirings cannot be micro-processed, the material used for the wirings has low resistance. Of course, the gate electrodes and the gate wirings may also be formed from the same material.

Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 mm or less.

Typically, it is possible to use a film comprising an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer.

In this embodiment, a laminate film of a tungsten nitride (WN) film having a thickness of 50 nm and a tungsten (W) film having a thickness of 350 nm is used. These may be formed by sputtering. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 5A:
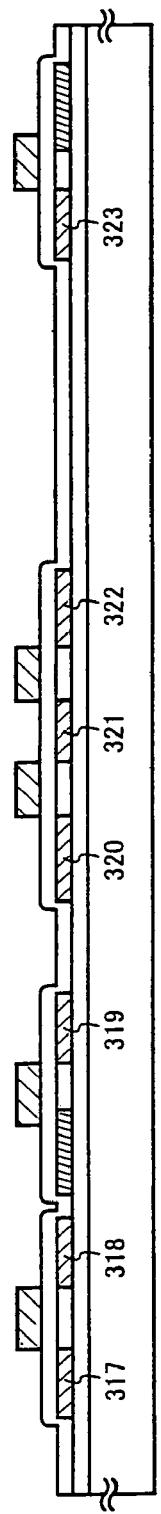
FIGS. 5A to 5D are diagrams showing manufacturing steps of an active matrix type EL display device.

Next, an n-type impurity element (phosphorous is used in embodiment 1) is added in a self-aligning manner with the gate electrodes 312 to 316 as masks, as shown in FIG. 5A. The addition is regulated so that phosphorous is added to impurity regions 317 to 323 thus formed at a concentration of $\frac{1}{10}$ to $\frac{1}{2}$ that of the n-type impurity regions 305 and 306 (typically between $\frac{1}{4}$ and $\frac{1}{3}$). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 5B:
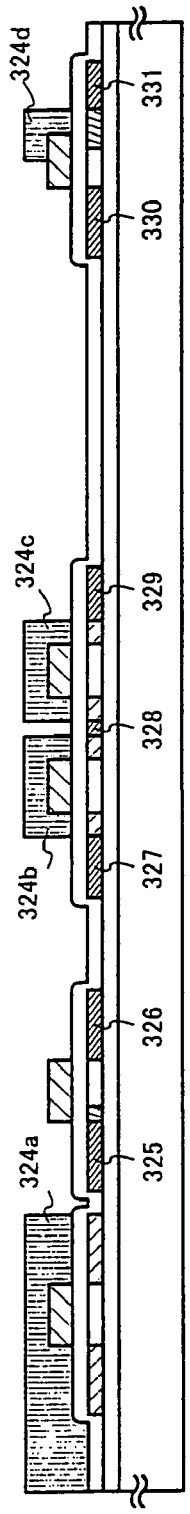

Resist masks 324a to 324d are formed next, with a shape covering the gate electrodes etc, as shown in FIG. 5B, and an n-type impurity element (phosphorous is used in embodiment 1) is added, forming impurity regions 325 to 331 containing a high concentration of phosphorous. Ion doping using phosphine (PH$_3$) is also performed here, and is regulated so that the phosphorous concentration of these regions is from $1\times10^{20}$ to $1\times10^{21}$ atoms/cm$^3$ (typically between $2\times10^{20}$ and $5\times10^{20}$ atoms/cm$^3$).

A source region or a drain region of the n-channel TFT is formed by this process, and in the switching TFT, a portion of the n-type impurity regions 320 to 322 formed by the process of FIG. 5A remains. These remaining regions correspond to the LDD regions 15a to 15d of the switching TFT in FIG. 2.

Figure 5C:
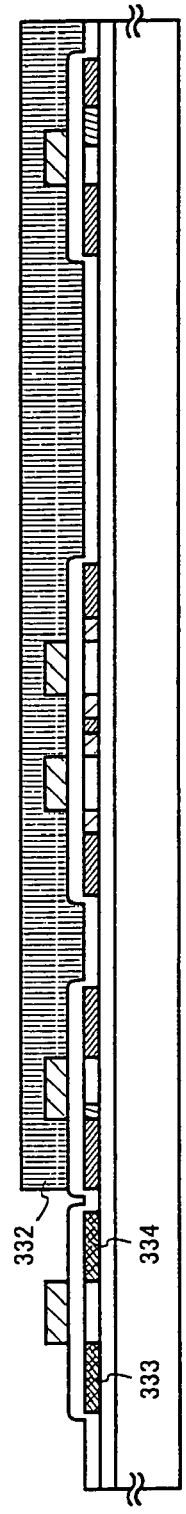
Figure 5D:
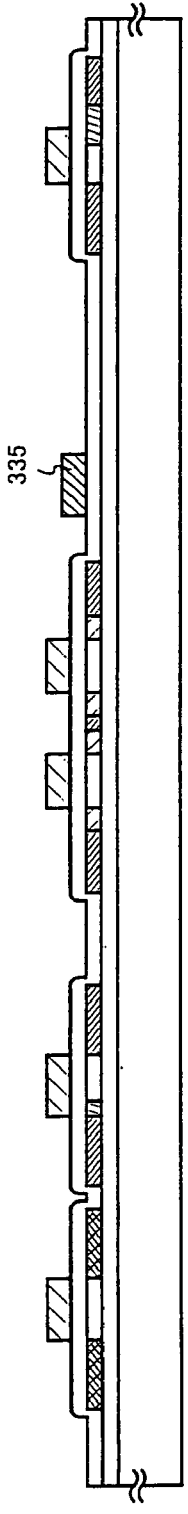

Next, as shown in FIG. 5C, the resist masks 324a to 324d are removed, and a new resist mask 332 is formed. A p-type impurity element (boron is used in embodiment 1) is then added, forming impurity regions 333 and 334 containing a high concentration of boron. Boron is added here to form impurity regions 333 and 334 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 333 and 334 at a concentration of $1\times10^{16}$ to $5\times10^{18}$ atoms/cm$^3$, but boron is added here at a concentration of at least 3 times more than that of the phosphorous. Therefore, the n-type impurity regions already formed completely invert to p-type, and function as p-type impurity regions.

Next, after removing the resist mask 332, the n-type and p-type impurity elements added at various concentrations are activated. Furnace annealing, laser annealing, or lamp annealing may be performed as a means of activation. Heat treatment is performed in embodiment 1 in a nitrogen atmosphere for 4 hours at 550° C. in an electric furnace.

It is important to remove as much of the oxygen in the atmosphere as possible at this time. This is because if any oxygen exists, then the exposed surface of the gate electrode oxidizes, inviting an increase in resistance, and at the same time it becomes more difficult to later make an ohmic contact. It is therefore preferable that the concentration of oxygen in the processing environment in the above activation process should be 1 ppm or less, preferably 0.1 ppm or less.

After the activation process is completed, a gate wiring 335 with a thickness of 300 nm is formed next. A metallic film having aluminum (Al) or copper (Cu) as its principal constituent (comprising 50 to 100% of the composition) may be used as the material of the gate wiring 335. As with the gate wiring 211 of FIG. 3, the gate wiring 335 is formed with a placement so that the gate electrodes 314 and 315 of the switching TFTs (corresponding to gate electrodes 19a and 19b of FIG. 3) are electrically connected. (See FIG. 5D.)

The wiring resistance of the gate wiring can be made extremely small by using this type of structure, and therefore a pixel display region (pixel portion) having a large surface area can be formed. Namely, the pixel structure of embodiment 1 is extremely effective because an EL display device having a screen size of a 10 inch diagonal or larger (in addition, a 30 inch or larger diagonal) is realized due to this structure.

Figure 6A:
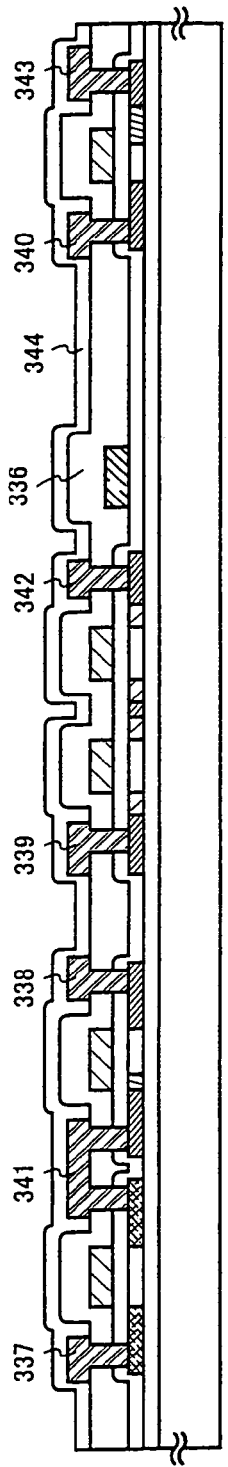
FIGS. 6A to 6C are diagrams showing manufacturing steps of an active matrix type EL display device.

A first interlayer insulating film 336 is formed next, as shown in FIG. 6A. A single layer insulating film containing silicon is used as the first interlayer insulating film 336, while a lamination film may be combined in between. Further, a film thickness of between 400 nm and 1.5 µm may be used. A lamination structure of an 800 nm thick silicon oxide film on a 200 nm thick silicon oxynitride film is used in embodiment 1.

In addition, heat treatment is performed for 1 to 12 hours at 300 to 450° C. in an environment containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336. Namely, hydrogen processing may be performed as above after forming the 200 nm thick silicon oxynitride film, and then the remaining 800 nm thick silicon oxide film may be formed.

Next, a contact hole is formed in the first interlayer insulating film 336, and source wiring lines 337 to 340 and drain wiring lines 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by sputtering. Of course, other conductive films may be used.

A first passivation film 344 is formed next with a thickness of 50 to 500 nm (typically between 200 and 300 nm). A 300 nm thick silicon oxynitride film is used as the first passivation film 344 in embodiment 1. This may also be substituted by a silicon nitride film. It is of course possible to use the same materials as those of the first passivation film 41 of FIG. 2.

Note that it is effective to perform plasma processing using a gas containing hydrogen such as $H_2$ or $NH_3$ etc. before the formation of the silicon oxynitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 6B:
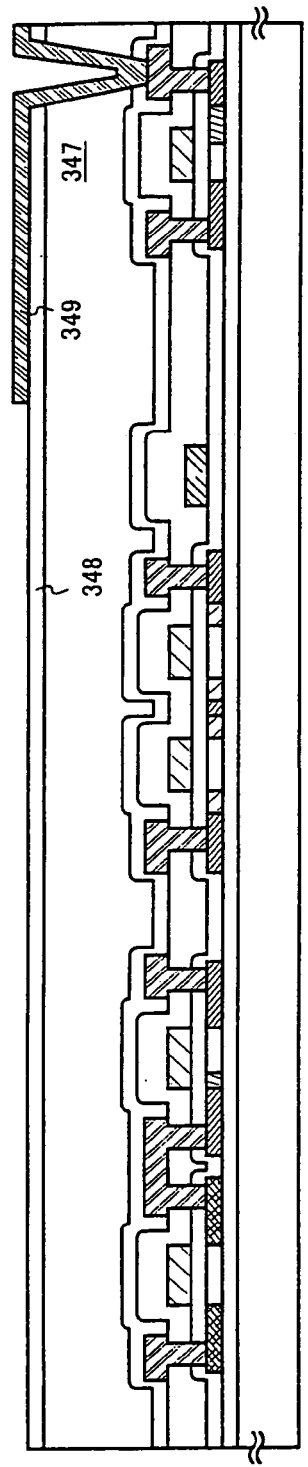

Next, as shown in FIG. 6B, a second interlayer insulating film 347 made of organic resin is formed. As the organic resin, it is possible to use polyimide, polyamide, acrylic, BCB (benzocyclobutene) or the like. Especially, since the second interlayer insulating film 347 is primarily used for flattening, acrylic, which is excellent in flattening properties is preferable. In this embodiment, an acrylic film is formed to a thickness sufficient to flatten a stepped portion formed by TFTs. It is appropriate that the thickness is preferably made 1 to 5 µm (more preferably, 2 to 4 µm).

Next, a second passivation film 348 having a thickness of 100 nm is formed on the second interlayer insulating film 347. In this embodiment, since an insulating film containing Si, Al, N, O and La is used, it is possible to prevent alkaline metal from diffusing from the EL layer provided thereon. At the same time, intrusion of moisture into the EL layer is blocked and heat generated in the EL layer is dissipated, so that it is possible to suppress deterioration of the EL layer due to heat and deterioration of the flattened film (second interlayer insulating film).

A contact hole reaching a drain wiring line 343 is formed through the second passivation film 348, the second interlayer insulating film 347, and the first passivation film 344, and a pixel electrode 349 is formed. In this embodiment, an indium-tin oxide (ITO) film having a thickness of 110 nm is formed, and patterning is carried out to form the pixel electrode. This pixel electrode 349 becomes an anode of the EL element. Incidentally, as other materials, it is also possible to use an indium-titanium oxide film or a film of ITO mixed with zinc oxide.

Incidentally, this embodiment has such a structure that the pixel electrode 349 is electrically connected to the drain region 331 of the current controlling TFT through the drain wiring line 343. This structure has merits as set forth below.

Since the pixel electrode 349 comes in direct contact with an organic material of an EL layer (light emitting layer) or charge transporting layer, there is a possibility that a movable ion contained in the EL layer or the like diffuses in the pixel electrode. That is, in the structure of this embodiment, the pixel electrode 349 is not directly connected to the drain region 331 as a part of the active layer, but the drain wiring line 343 is made to intervene so that intrusion of the movable ion into the active layer can be prevented.

Figure 6C:
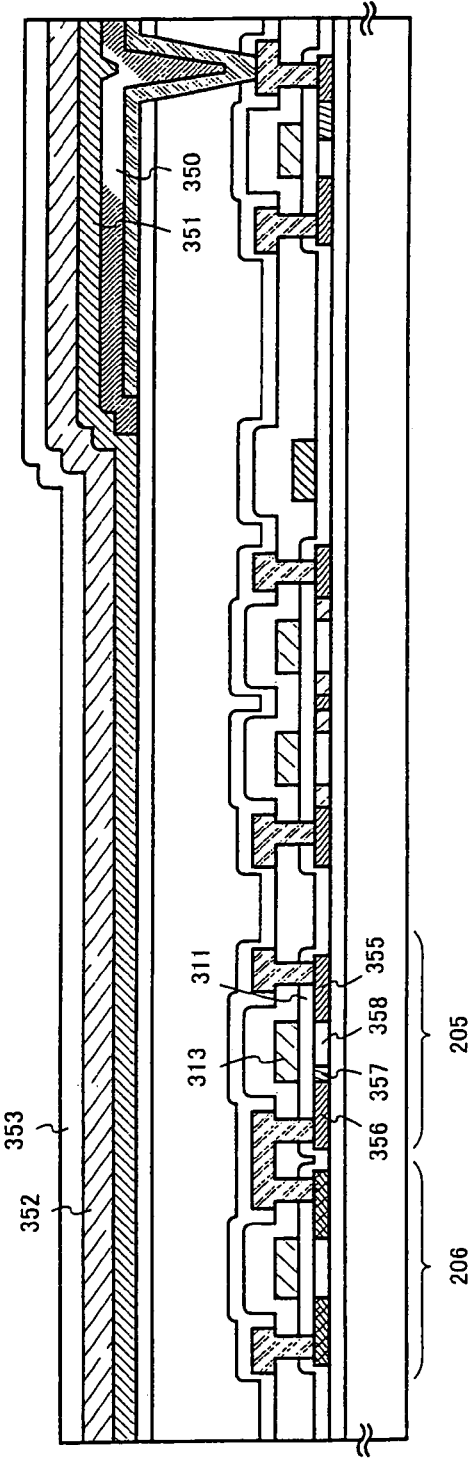

Next, as shown in FIG. 6C, an EL layer 350 is formed by printing explained by use of FIG. 1, and further, a cathode (MgAg electrode) 351 and a protecting electrode 352 are formed by evaporation without opening to the air. At this time, it is preferable to completely remove moisture by carrying out a heat treatment to the pixel electrode 349 before the EL layer 350 and the cathode 351 are formed. In this embodiment, although the MgAg electrode is used as the cathode of the EL element, other well-known materials are also acceptable.

As the EL layer 350, the materials explained in the Embodiment Mode section can be used. In this embodiment, although a two-layer structure of a hole transporting layer and a light emitting layer is made an EL layer, there is also a case where either one of a hole injecting layer, an electron injecting layer, or an electron transporting layer is provided. Like this, various examples have already been reported for the combination, and any structure of them may be used.

In this embodiment, as the hole transporting layer, poly-tetrahydrothiophenylphenylene that is a polymer precursor, is formed by a printing method and is converted to polyphenylene vinylene by heating. As the light emitting layer, a material obtained by molecular dispersion of PBD of 1,3, 4-oxadiazole derivatives of 30 to 40% into polyvinylcarbazole is formed by evaporation, and coumarin 6 of about 1% is added as the center of green light emission.

Although even the protective electrode 352 can protect the EL layer 350 from moisture or oxygen, preferably, a third passivation film 353 may be provided. In this embodiment, as the third passivation film 353, a silicon nitride film having a thickness of 300 nm is provided. This third passivation film may also be formed continuously after the protective electrode 352 without opening to the air. Of course, as the third passivation film 353, the same material as the third passivation film 50 of FIG. 2 may be used.

Besides, the protective electrode 352 is provided to prevent degradation of the MgAg electrode 351, and a metal film containing aluminum as its main ingredient is typical. Of course, another material may be used. Since the EL layer 350 and the MgAg electrode 351 are very weak to moisture, it is preferable to make continuous formation to the protective electrode 352 without opening to the air so that the EL layer is protected from the outside air.

Incidentally, it is appropriate that the film thickness of the EL layer 350 is made 10 to 400 nm (typically 60 to 150 nm, preferably 100 to 120 nm), and the thickness of the MgAg electrode 351 is made 80 to 200 nm (typically 100 to 150 nm).

In this way, an active matrix EL display device having a structure as shown in FIG. 6C is completed. In the active matrix EL display device of this embodiment, TFTs having optimum structure are disposed in not only the pixel portion but also the driving circuit portion, so that very high reliability is obtained and operation characteristics can also be improved.

First, a TFT having a structure to decrease hot carrier injection so as not to drop the operation speed thereof as much as possible is used as an n-channel TFT 205 of a CMOS circuit forming a driving circuit. Incidentally, the driving circuit here includes a shift register, a buffer, a level shifter, a sampling circuit (sample and hold circuit) and the like. In the case where digital driving is performed, a signal conversion circuit such as a D/A converter can also be included.

In the case of this embodiment, as shown in FIG. 6C, the active layer of the n-channel TFT 205 includes a source region 355, a drain region 356, an LDD region 357 and a channel formation region 358, and the LDD region 357 overlaps with the gate electrode 313, putting the gate insulating film 311 therebetween.

Consideration not to drop the operation speed is the reason why the LDD region is formed at only the drain region side. In this n-channel TFT 205, it is not necessary to pay attention to an off current value very much, rather, it is better to give importance to an operation speed. Thus, it is desirable that the LDD region 357 is made to completely overlap with the gate electrode to decrease a resistance component to a minimum. That is, it is preferable to remove the so-called offset.

In the p-channel TFT 206 of the CMOS circuit, since deterioration due to hot carrier injection can be almost neglected, an LDD region does not have to be particularly provided. Of course, similarly to the n-channel TFT 205, it is also possible to provide an LDD region to take a countermeasure against hot carriers.

Incidentally, a sampling circuit among driving circuits is rather specific as compared with other circuits, and a large current flows through a channel formation region in both directions. That is, the roles of a source region and a drain region are counterchanged. Further, it is necessary to suppress an off current value to the lowest possible value, and in that meaning, it is preferable to dispose a TFT having an approximately intermediate function between the switching TFT and the current controlling TFT.

Figure 10:
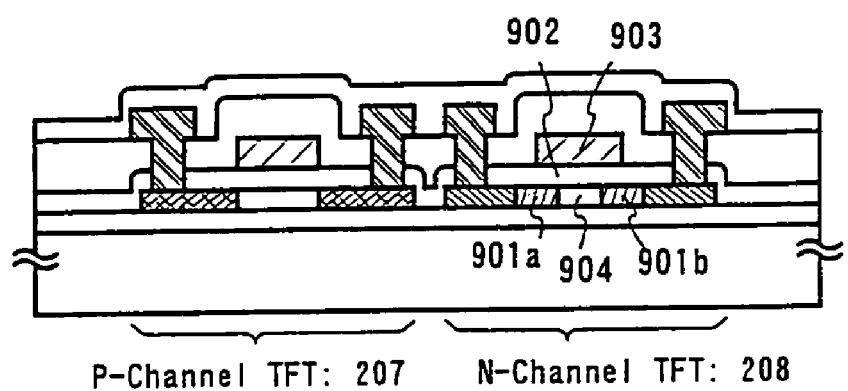
FIG. 10 is a diagram showing an element structure of a sampling circuit of an EL display device.

Thus, as an n-channel TFT forming the sampling circuit, it is preferable to dispose a TFT having a structure as shown in FIG. 10. As shown in FIG. 10, parts of LDD regions 901*a* and 901*b* overlap with a gate electrode 903, through a gate insulating film 902. This effect is as set forth in the explanation of the current controlling TFT 202, and a different point is that in the sampling circuit, the LDD regions 901*a* and 901*b* are provided to be put at both sides of a channel formation region 904.

When the state of FIG. 6C is completed, it is preferable in practice to make packaging (sealing) by a housing member such as a protection film having high airtightness and less degassing (laminate film, ultraviolet ray curing resin film, etc.) or a ceramic sealing can so as to prevent exposure to the outer air. At that time, when the inside of the housing member is made an inert gas atmosphere, or a moisture absorbent (for example, barium oxide) is disposed in the inside, the reliability (lifetime) of the EL layer is improved.

After the airtightness is raised by processing such as packaging, a connector (flexible print circuit: FPC) for connecting a terminal extended from the element or circuit formed on the substrate to an external signal terminal is attached so that a product is completed. In the present specification, the EL display device, which is made to have such a state that it can be shipped, is called an EL module.

Here, the structure of the active matrix EL display device of this embodiment will be described with reference to a perspective view of FIG. 7. The active matrix EL display device of this embodiment is constituted by a pixel portion 602, a gate side driving circuit 603, and a source side driving circuit 604 formed over a glass substrate 601. A switching TFT 605 of a pixel portion is an n-channel TFT, and is disposed at an intersection point of a gate wiring line 606 connected to the gate side driving circuit 603 and a source wiring line 607 connected to the source side driving circuit 604. The drain of the switching TFT 605 is connected to the gate of a current controlling TFT 608.

Further, the source of the current controlling TFT 608 is connected to a current supply line 609, and an EL element 610 is connected to the drain of the current controlling TFT 608.

Input-output wiring lines (connection wiring lines) 612 and 613 for transmitting signals to the driving circuits and an input-output wiring line 614 connected to the current supply line 609 are provided in an FPC 611 as an external input-output terminal.

Figure 7:
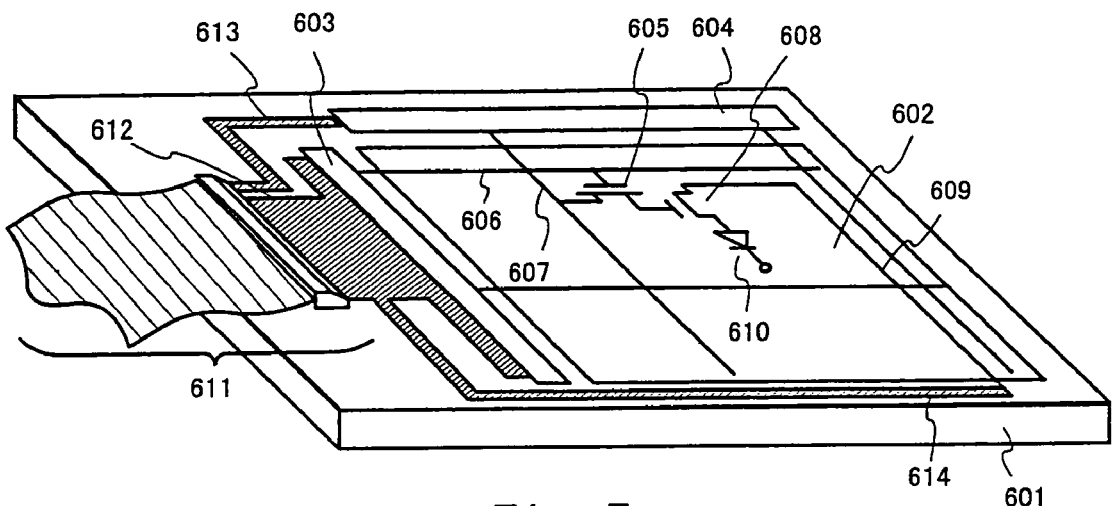
FIG. 7 is a diagram showing the outer appearance of an EL module.
Figure 8:
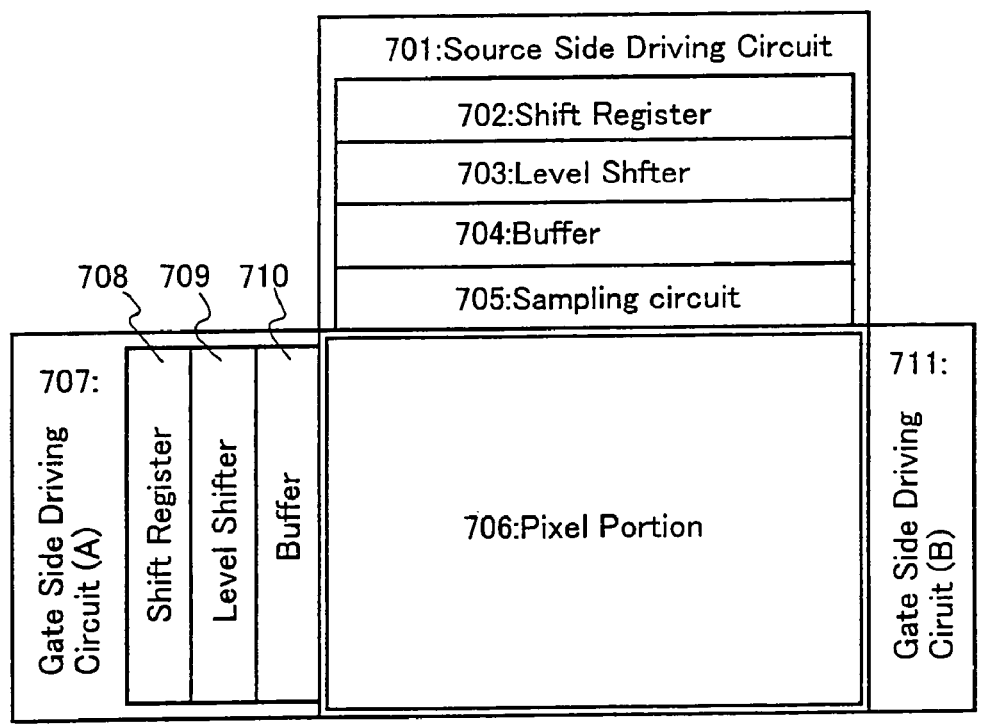
FIG. 8 is a diagram showing a circuit block structure of an EL display device.

An example of circuit structure of the EL display device shown in FIG. 7 is shown in FIG. 8. The EL display device of this embodiment includes a source side driving circuit 701, a gate side driving circuit (A) 707, a gate side driving circuit (B) 711, and a pixel portion 706. Note that through the specification, the term "driving circuit" is a generic term including the source side driving circuit and the gate side driving circuit.

The source side driving circuit 701 comprises a shift register 702, a level shifter 703, a buffer 704, and a sampling circuit (sample and hold circuit) 705. The gate side driving circuit (A) 707 comprises a shift register 708, a level shifter 709, and a buffer 710. The gate side driving circuit (B) 711 also has the similar structure.

Here, the shift registers 702 and 708 have driving voltages of 5 to 16 V (typically 10 V) respectively, and the structure indicated by 205 in FIG. 6C is suitable for an n-channel TFT used in a CMOS circuit forming the circuit.

Besides, for each of the level shifters 703 and 709 and the buffers 704 and 710, similarly to the shift register, the CMOS circuit including the n-channel TFT 205 of FIG. 6C is suitable. Note that it is effective to make a gate wiring line a multi-gate structure such as a double gate structure or a triple gate structure in improvement of reliability of each circuit.

Further, since the source region and drain region are inverted and it is necessary to decrease an off current value, a CMOS circuit including the n-channel TFT 208 of FIG. 10 is suitable for the sampling circuit 705.

The pixel portion 706 are disposed pixels having the structure shown in FIG. 2.

The foregoing structure can be easily realized by manufacturing TFTs in accordance with the manufacturing steps shown in FIGS. 4A to 6C. In this embodiment, although only the structure of the pixel portion and the driving circuit is shown, if the manufacturing steps of this embodiment are used, it is possible to form a logic circuit other than the driving circuit, such as a signal dividing circuit, a D/A converter circuit, an operational amplifier circuit, a ã-correction circuit, or the like on the same substrate, and further, it is presumed that a memory portion, a microprocessor, or the like can be formed.

Figure 11A:
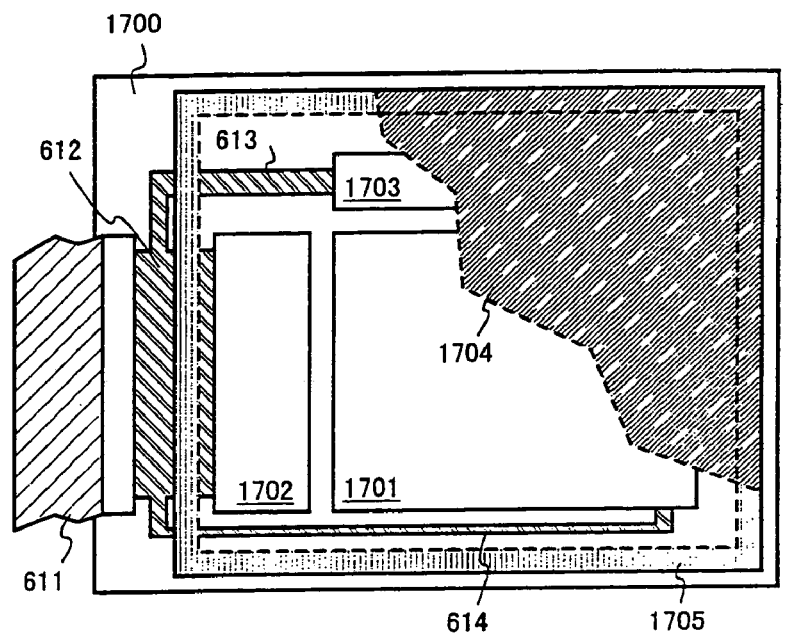
FIGS. 11A and 11B are diagrams showing the outer appearance and a cross sectional view of an EL module.

Further, an EL module of this embodiment including a housing member as well will be described with reference to FIGS. 11A and 11B. Incidentally, as needed, reference numbers used in FIGS. 7 and 8 will be quoted.

A pixel portion 1701, a source side driving circuit 1702, and a gate side driving circuit 1703 are formed on a substrate (including a base film below a TFT) 1700. Each wiring line from the respective driving circuits lead to an FPC 611 through input wiring lines 612 to 614 and are connected to an external equipment.

At this time, a housing member 1704 is provided to surround at least the pixel portion, preferably the driving circuit and the pixel portion. The housing member 1704 has such a shape as to have a recess portion with an inner size (depth) larger than an outer size (height) of the pixel portion 1701 or a sheet shape, and is fixed by an adhesive 1705 to the substrate 1700 so as to form an airtight space in cooperation with the substrate 1700. At this time, the EL element is put in such a state that it is completely sealed in said airtight space, and is completely shut off from the outer air. Incidentally, a plurality of housing members 1704 may be provided.

As a material of the housing member 1704, an insulating material such as glass or polymer is preferable. For example, amorphous glass (boro-silicate glass, quartz, etc.), crystallized glass, ceramic glass, organic resin (acrylic resin, styrene resin, polycarbonate resin, epoxy resin, etc.), and silicone resin are enumerated. Besides, ceramics may be used. If the adhesive 1705 is an insulating material, a metal material such as a stainless alloy can also be used.

As a material of the adhesive 1705, an adhesive of epoxy resin, acrylate resin, or the like can be used. Further, thermosetting resin or photo-curing resin can also be used as the adhesive. However, it is necessary to use such material as to block penetration of oxygen and moisture to the utmost.

Further, it is preferable that a space 1706 between the housing member and the substrate 1700 is filled with an inert gas (argon, helium, nitrogen, etc.). Other than the gas, an inert liquid (liquid fluorinated carbon typified by perfluoroalkane, etc.) can also be used. With respect to the inert liquid, a material as used in Japanese Patent Application Laid-open No. Hei 8-78159 may be used.

It is also effective to provide a drying agent in the space 1706. As the drying agent, a material as disclosed in Japanese Patent Application Laid-open No. Hei 9-148066 can be used. Typically, barium oxide may be used.

Figure 11B:
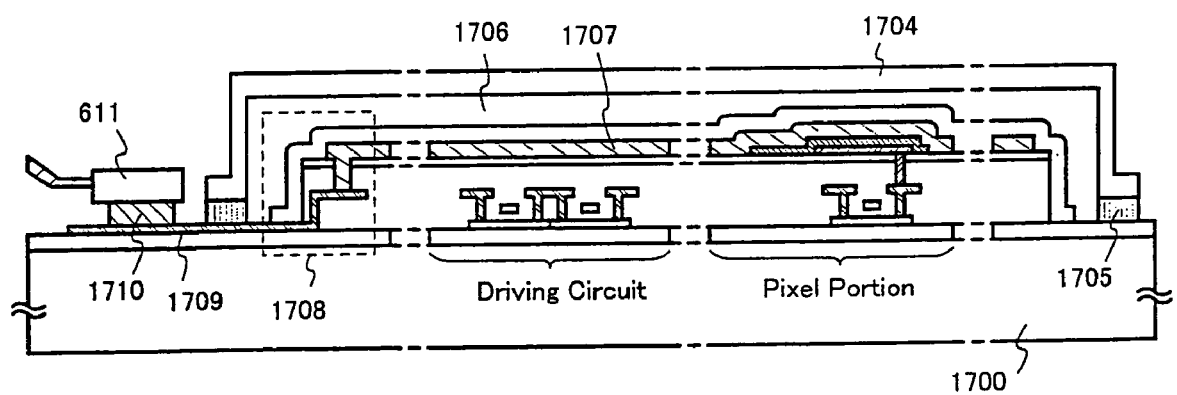

Besides, as shown in FIG. 11B, a plurality of pixels each including isolated EL elements is provided in a pixel portion, and all of them include a protective electrode 1707 as a common electrode. In this embodiment, although the description has been made such that it is preferable to continuously form the EL layer, the cathode (MgAg electrode) and the protective electrode without opening to the air, if the EL layer and the cathode are formed by using the same mask member, and only the protective electrode is formed by a different mask member, the structure of FIG. 11B can be realized.

At this time, the EL layer and the cathode may be formed only on the pixel portion, and it is not necessary to provide them on the driving circuit. Of course, although a problem does not arise if they are provided on the driving circuit, when it is taken into consideration that alkaline metal is contained in the EL layer, it is preferable not to provide.

Incidentally, the protective electrode 1707 is connected to an input wiring line 1709 in a region indicated by 1708. The input wiring line 1709 is a wiring line to give a predetermined voltage (in this embodiment, earthing potential, concretely 0V) to the protective electrode 1707, and is connected to the FPC 611 through a conductive paste material 1710.

Here, manufacturing steps for realizing a contact structure in the region 1708 will be described with reference to FIG. 12.

Figure 12A:
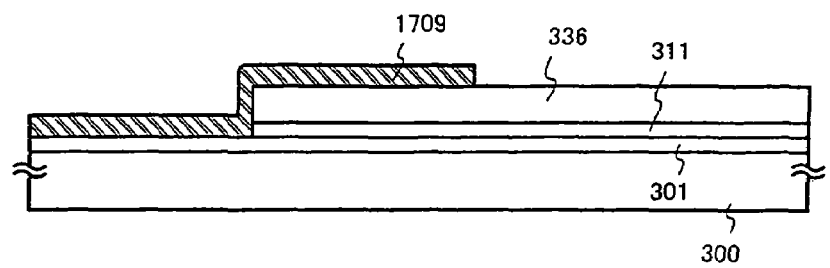
FIGS. 12A to 12C are diagrams showing manufacturing steps of a contact structure.

First, in accordance with the steps of this embodiment, the state of FIG. 6A is obtained. At this time, at an end portion of the substrate (region indicated by 1708 in FIG. 11B), the first interlayer insulating film 336 and the gate insulating film 311 are removed, and an input wiring line 1709 is formed thereon. Of course, it is formed at the same time as the source wiring line and the drain wiring line of FIG. 6A (FIG. 12A).

Figure 12B:
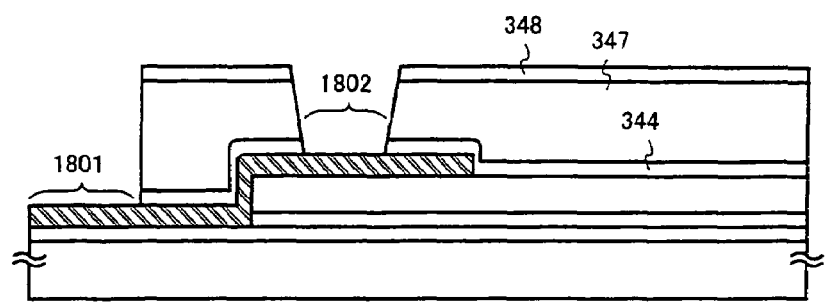
Figure 12C:
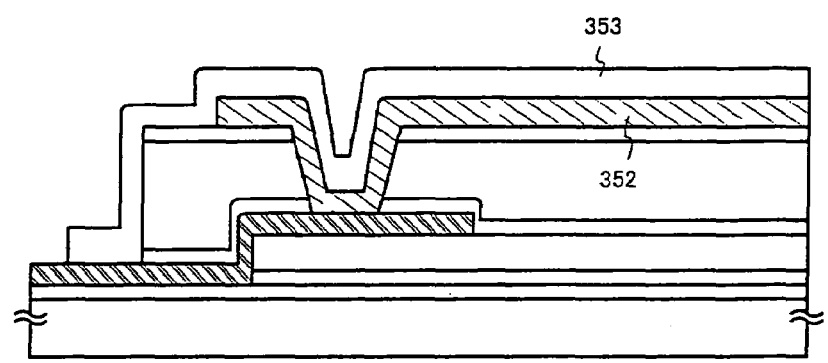

Next, in FIG. 6B, when the second passivation film 348, the second interlayer insulating film 347, and the first passivation film 344 are etched, a region indicated by 1801 is removed, and an opening portion 1802 is formed (FIG. 12B).

In this state, in the pixel portion, a forming step of an EL element (forming step of a pixel electrode, an EL layer and a cathode) is carried out. At this time, in the region shown in FIG. 12, a mask member is used so that the EL element is not formed. After a cathode 351 is formed, a protective electrode 352 is formed by using another mask member. By this, the protective electrode 352 and the input wiring line 1709 are electrically connected. Further, a third passivation film 353 is provided to obtain the state of FIG. 12C.

Through the foregoing steps, the contact structure of the region indicated by 1708 of FIG. 11B is realized. The input-output wiring line 1709 is connected to the FPC 611 through a gap between the housing member 1704 and the substrate 1700 (however, the gap is filled with the adhesive 1705. That is, the adhesive 1705 is required to have such a thickness as to be able to sufficiently flatten unevenness due to the input-output wiring line). Incidentally, although the description has been made here on the input-output wiring line 1709, other output wiring lines 612 to 614 are also connected to the FPC 611 through the portion under the housing member 1704 in the same manner.

Embodiment 2

Figure 13:
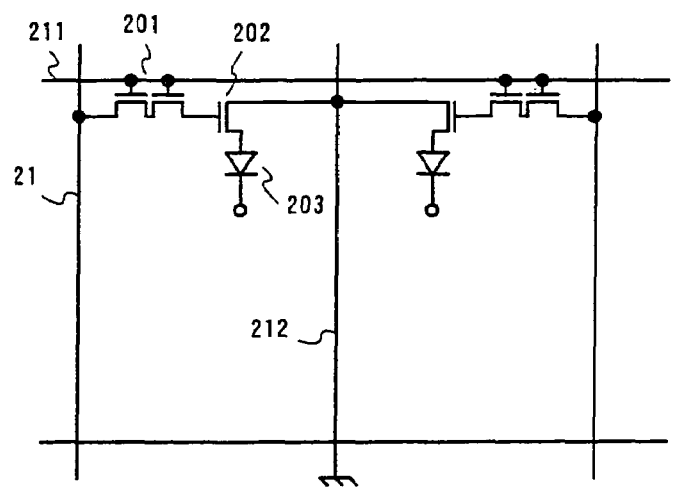
FIG. 13 is a diagram showing a structure at a pixel portion of an EL display device.

In this embodiment, an example in which a structure of a pixel is made different from the structure shown in FIG. 3B will be described with reference to FIG. 13.

In this embodiment, two pixels shown in FIG. 3B are arranged to become symmetrical with respect to a current supply line 212 for applying ground voltage. That is, as shown in FIG. 13, a current supply line 212 is made common to two adjacent pixels, so that the number of necessary wiring lines can be reduced. Incidentally, a TFT structure or the like arranged in the pixel may remain the same.

If such structure is adopted, it becomes possible to manufacture a more minute pixel portion, and the quality of an image is improved.

Note that the structure of this embodiment can be easily realized in accordance with the manufacturing steps of the embodiment 1, and with respect to the TFT structure or the like, the description of the embodiment 1 or FIG. 2 may be referred to.

Embodiment 3

Figure 14:
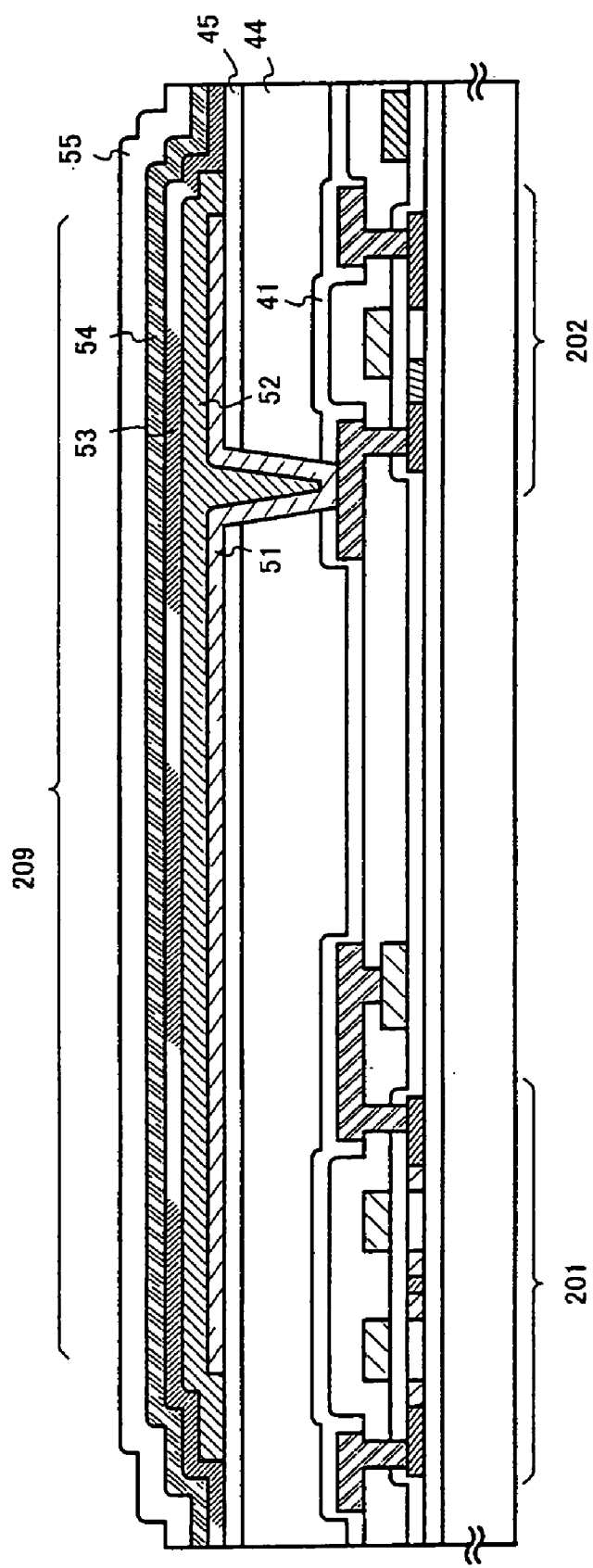
FIG. 14 is a diagram showing a sectional structure of a pixel portion of an EL display device.

In this embodiment, a case where a pixel portion having a structure different from FIG. 2 will be described with reference to FIG. 14. Note that the steps up to a step of forming a second interlayer insulating film 44 may be carried out in accordance with the embodiment 1. Since a switching TFT 201 and a current controlling TFT 202 covered with the second interlayer insulating film 44 have the same structure as that in FIG. 1, the description here is omitted.

In the case of this embodiment, after a contact hole is formed through the second passivation film 45, the second interlayer insulating film 44, and the first passivation film 41, a pixel electrode 51 is formed, and then, a cathode 52 and an EL layer 53 are formed. In this embodiment, after the cathode 52 is formed by vacuum evaporation, the EL layer 53 is formed by relief printing or screen printing while a dry inert gas atmosphere is maintained.

In this embodiment, an aluminum alloy film (aluminum film containing titanium of 1 wt %) having a thickness of 150 nm is provided as the pixel electrode 51. As a material of the pixel electrode, although any material may be used as long as it is a metal material, it is preferable that the material has high reflectivity. A MgAg electrode having a thickness of 120 nm is used as the cathode 52, and the thickness of the EL layer 53 is made 120 nm.

In this embodiment, an EL forming substance is manufactured by mixing a solvent to EL material, that is obtained from molecular dispersion of PBD of 1,3,4-oxadiazole derivatives of 30 to 40% into polyvinylcarbazole and by adding coumarin 6 of about 1% as the center of light emission. The EL forming substance is applied by relief printing or screen printing, and baking treatment is carried out, so that a green light emitting layer having a thickness of 50 nm is obtained. TPD having a thickness of 70 nm is formed thereon by evaporation and the EL layer 53 is obtained.

Next, an anode 54 made of a transparent conductive film (in this embodiment, an ITO film) is formed to a thickness of 110 nm. In this way, an EL element 209 is formed, and when a third passivation film 55 is formed by a material shown in the embodiment 1, the pixel having the structure as shown in FIG. 14 is completed.

In the case where the structure of this embodiment is adopted, green light generated in each pixel is radiated to a side opposite to the substrate on which the TFT is formed. Thus, almost all regions in the pixel, that is, even the region where the TFT is formed can also be used as an effective light emitting region. As a result, an effective light emitting area of the pixel is greatly improved, and the brightness and contrast ratio (ratio of light to shade) of an image is increased.

Incidentally, the structure of this embodiment can be freely combined with any of the embodiments 1 and 2.

Embodiment 4

Although the description has been made on the case of the top gate type TFT in the embodiments 1 to 4, the present invention is not limited to the TFT structure, and may be applied to a bottom gate type TFT (typically, reverse stagger type TFT). Besides, the reverse stagger type TFT may be formed by any means.

Since the reverse stagger type TFT has such a structure that the number of steps can be easily made smaller than the top gate type TFT, it is very advantageous in reducing the manufacturing cost, which is the object of the present invention. Incidentally, the structure of this embodiment can be freely combined with any structure of the embodiments 2 and 3.

Embodiment 5

It is effective to use a material having a high thermal radiating effect, similar to that of the second passivation film 45, as the base film formed between the active layer and the substrate in the structures of FIG. 6C of embodiment 1 or FIG. 2. In particular, current flows in the current control TFT for a long time, and therefore heat is easily generated, and deterioration due to self generation of heat can become a problem. Thermal deterioration of the TFT can be prevented by using the base film of embodiment 5, which has a thermal radiating effect, for this type of case.

The effect of protecting from the diffusion of movable ions from the substrate is also very important, of course, and therefore it is preferable to use a lamination structure of a compound including Si, Al, N, O, and M, and an insulating film containing silicon, similar to the first passivation film 41.

Note that it is possible to freely combine the constitution of embodiment 5 with the constitution of any of embodiments 1 to 4.

Embodiment 6

When the pixel structure shown in embodiment 3 is used, the light emitted from the EL layer is radiated in the direction opposite to the substrate, and therefore it is not necessary to pay attention to the transmissivity of materials, such as the insulating film, which exist between the substrate and the pixel electrode. In other words, materials which have a somewhat low transmissivity can also be used.

It is therefore advantageous to use a carbon film, such as one referred to as a diamond thin film or an amorphous carbon film, as the base film 12, the first passivation film 41 or the second passivation film 45. In other words, because it is not necessary to worry about lowering the transmissivity, the film thickness can be set thick, to between 100 and 500 nm, and it is possible to have a very high thermal radiating effect.

Regarding the use of the above carbon films in the third passivation film 50, note that a reduction in the transmissivity must be avoided, and therefore it is preferable to set the film thickness to between 5 and 100 nm.

Note that, in embodiment 6, it is effective to laminate with another insulating film when a carbon film is used in any of the base film 12, the first passivation film 41, the second passivation film 45 and the third passivation film 50.

In addition, embodiment 6 is specifically effective when the pixel structure shown in embodiment 3 is used, but it is also possible to freely combine the constitution of embodiment 6 with the constitution of any of embodiments 1, 2, 4 and 5.

Embodiment 7

The amount of the off current value in the switching TFT in the pixel of the EL display device is reduced by using a multi-gate structure for the switching TFT, and the present invention is characterized by the elimination of the need for a storage capacitor. This is a device for making good use of the surface area, reserved for the storage capacitor, as an emitting region.

However, even if the storage capacitor is not completely eliminated, an effect of increasing the effective emitting surface area, by the amount that the exclusive surface area is made smaller, can be obtained. In other words, the object of the present invention can be sufficiently achieved by reducing the value of the off current by using a multi-gate structure for the switching TFT, and by only shrinking the exclusive surface area of the storage capacitor.

Figure 15:
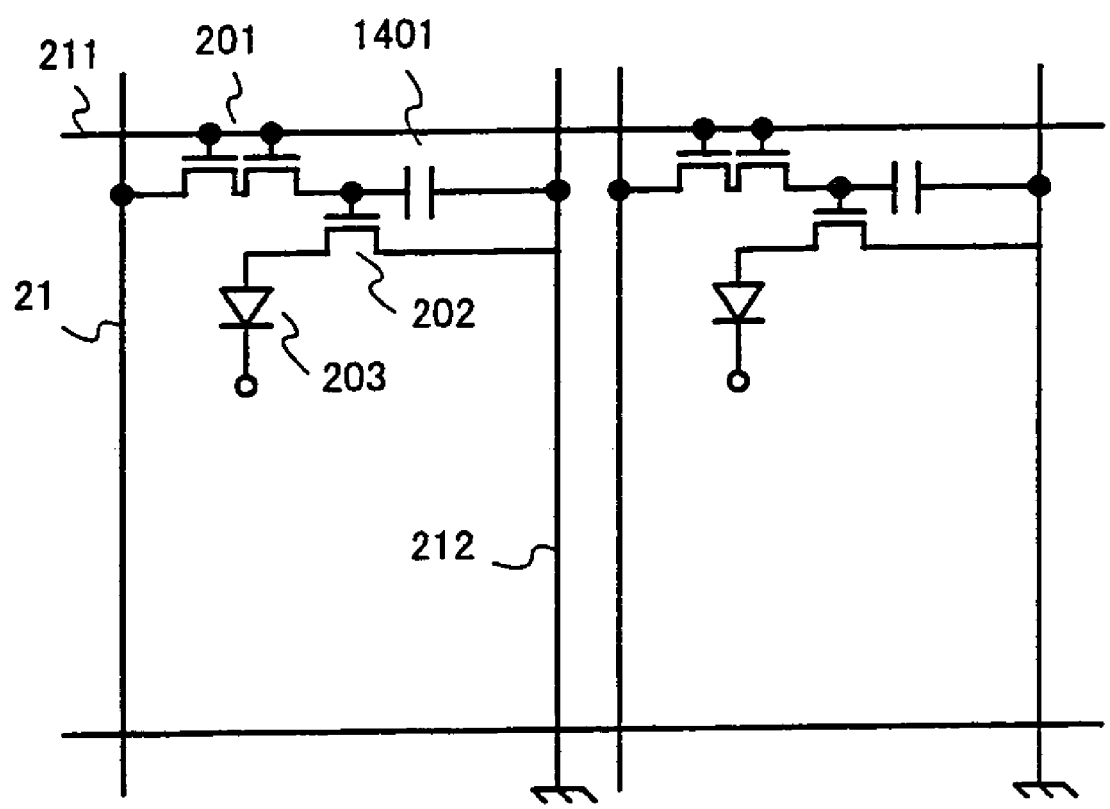
FIG. 15 is a diagram showing a structure at a pixel portion of an EL display device.

In that case as shown in FIG. 15 it is acceptable to form a storage capacitor 1401 in parallel to the gate of the current control TFT 202 with respect to the drain of the switching TFT 201.

Note that the constitution of embodiment 7 can be freely combined with any constitution of embodiments 1 to 6. Namely, a storage capacitor is merely formed within a pixel and it is not to limit the TFT structure, materials of EL layer, etc.

Embodiment 8

Laser crystallization is used as the means of forming the crystalline silicon film 302 in embodiment 1, and a case of using a different means of crystallization is explained in embodiment 8.

After forming an amorphous silicon film in embodiment 8, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application No. Hei 11-076967 by the applicant of the present invention.

The processes of manufacturing shown in embodiment 1 are one embodiment of the present invention, and provided that the structure of FIG. 2 or of FIG. 6C of embodiment 1 can be realized, then other manufacturing process may also be used without any problems, as above.

Note that it is possible to freely combine the constitution of embodiment 8 with the constitution of any of embodiments 1 to 7.

Embodiment 9

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current control TFT. The current flowing in an EL element is then controlled by the current control TFT, the EL element light emitting intensity is controlled, and gray scale display is performed. Note that the current control TFT may be operated in a saturation region in case of performing analog driving.

On the other hand, when digital driving is performed, it differs from the analog type gray scale display, and gray scale display is performed by time ratio gray scale method. Namely, by regulating the length of the light emission time, color gray scales can be made to be seen visually as changing. In case of performing digital driving, it is preferable to operate the current control TFT in the linear region.

The EL element has an extremely fast response speed in comparison to a liquid crystal element, and therefore it is possible to have high speed driving. Therefore, the EL element is one which is suitable for time ratio gray scale method, in which one frame is partitioned into a plural number of subframes and then gray scale display is performed.

The present invention is a technique related to the element structure, and therefore any method of driving it may thus be used.

Embodiment 10

In embodiment 1 it is preferable to use an organic EL material as an EL layer, but the present invention can also be implemented using an inorganic EL material. However, current inorganic EL materials have an extremely high driving voltage, and therefore a TFT which has voltage resistance characteristics that can withstand the driving voltage must be used in cases of performing analog driving.

Alternatively, if inorganic EL materials having lower driving voltages than conventional inorganic EL materials are developed, then it is possible to apply them to the present invention.

Further, it is possible to freely combine the constitution of embodiment 10 with the constitution of any of embodiments 1 to 9.

Embodiment 11

An active matrix EL display device (EL module) formed by implementing the present invention has superior visibility in bright locations in comparison to a liquid crystal display device because it is a self-emitting type device. It therefore has a wide range of uses as a direct-view type EL display (indicating a display incorporating an EL module).

Note that a wide viewing angle can be given as one advantage which the EL display has over a liquid crystal display. The EL display of the present invention may therefore be used as a display (display monitor) having a diagonal equal to 30 inches or greater (typically equal to 40 inches or greater) for appreciation of TV broadcasts by large screen.

Further, not only can it be used as an EL display (such as a personal computer monitor, a TV broadcast reception monitor, or an advertisement display monitor), it can be used as a display for various electronic devices.

The following can be given as examples of such electronic devices: a video camera; a digital camera; a goggle type display (head mounted display); a car navigation system; a personal computer; a portable information terminal (such as a mobile computer, a mobile telephone, or an electronic book); and an image playback device using a recording medium (specifically, a device which performs playback of a recording medium and is provided with a display which can display those images, such as a compact disk (CD), a laser disk (LD), or a digital versatile disk (DVD)). Examples of these electronic devices are shown in FIGS. 16A to 16F.

Figure 16A:
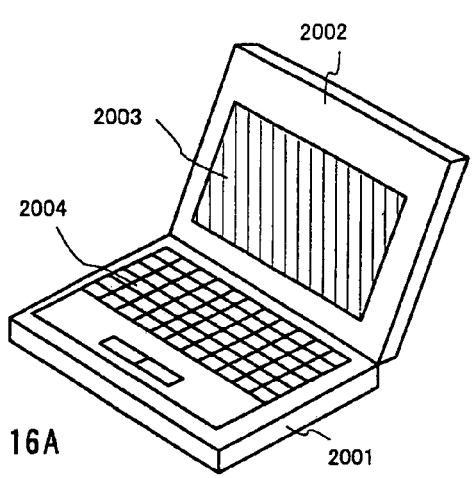
FIGS. 16A to 16F are diagrams showing concrete examples of electronic devices.

FIG. 16A is a personal computer, comprising a main body 2001, a casing 2002, a display portion 2003, and a keyboard 2004. The present invention can be used in the display portion 2003.

Figure 16B:
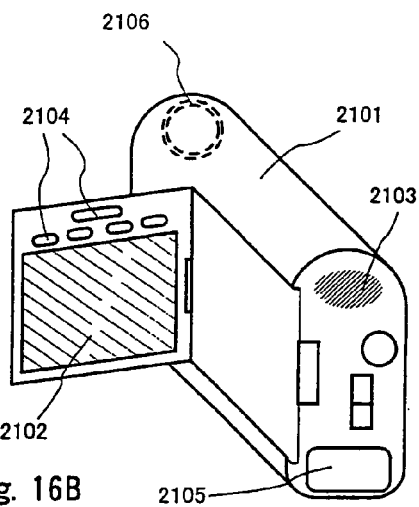

FIG. 16B is a video camera, comprising a main body 2101, a display portion 2102, an audio input portion 2103, operation switches 2104, a battery 2105, and an image receiving portion 2106. The present invention can be used in the display portion 2102.

Figure 16C:
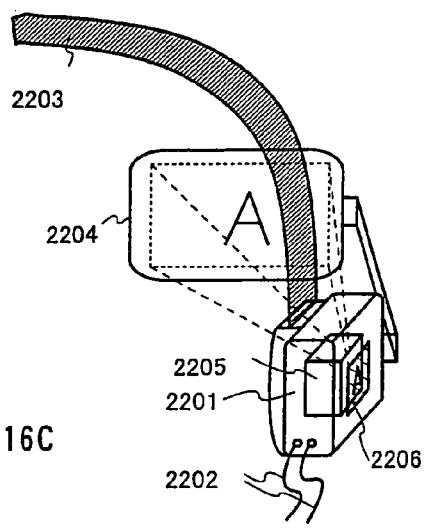

FIG. 16C is a portion of a head-mounted type EL display (right hand side), comprising a main body 2201, a signal cable 2202, a fastening band 2203, a display monitor 2204, an optical system 2205 and a display device 2206. The present invention can be used in the display device 2206.

Figure 16D:
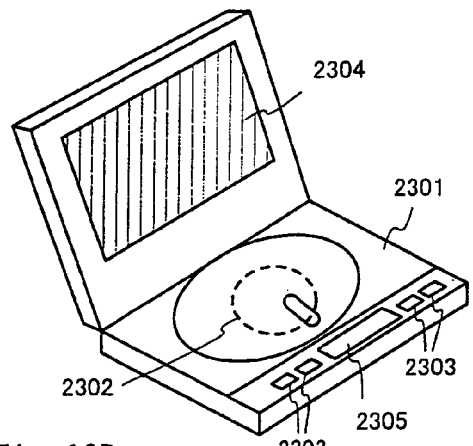

FIG. 16D is an image playback device (specifically, a DVD playback device) provided with a recording medium, comprising a main body 2301, a recording medium (such as a CD, an LD, or a DVD) 2302, operation switches 2303, a display portion (a) 2304, and a display portion (b) 2305. The display portion (a) is mainly used for displaying image information, and the image portion (b) is mainly used for displaying character information, and the present invention can be used in the image portion (a) and in the image portion (b). Note that the present invention can be used as an image playback device provided with a recording medium in devices such as a CD playback device and game equipment.

Figure 16E:
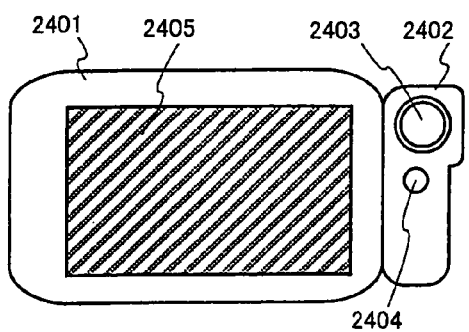

FIG. 16E is a mobile computer, comprising a main body 2401, a camera portion 2402, an image receiving portion 2403, operation switches 2404, and a display portion 2405. The present invention can be used in the display portion 2405.

Figure 16F:
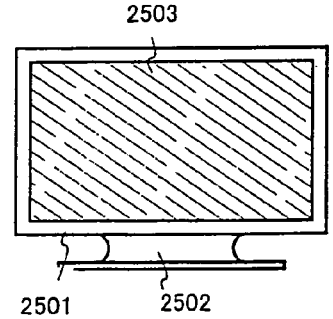

FIG. 16F is an EL display, comprising a casing 2501, a support stand 2502, and a display portion 2503. The present invention can be used in the display portion 2503. Because EL displays have large viewing angle, they are especially advantageous for cases in which the screen is made large, and is favorable for displays having a diagonal greater than or equal to 10 inches (especially one which is greater than or equal to 30 inches).

Furthermore, if the emission luminance of EL materials becomes higher in future, then it will become possible to use the present invention in a front type or a rear type projector by enlarging and projecting the light which includes outputted image information by a lens, etc.

The range of applications of the present invention is thus extremely wide, and it is possible to apply the present invention to electronic devices in all fields. Furthermore, the electronic devices of embodiment 11 can be realized by using any constitution of any combination of embodiments 1 to 10.

By implementing the present invention, the formation of the EL layer can be made at an extremely low cost. Thus, the manufacturing cost of the EL display device can be reduced.

Besides, by providing the insulating film capable of preventing penetration of alkali metal between the EL layer and the TFT, it is possible to prevent the alkali metal from diffusing out of the EL layer and from badly influencing the TFT characteristics. As a result, the operation performance and reliability of the EL display device can be greatly improved.

Besides, by using the EL display device, which can be manufactured at a low cost, as a display, the manufacturing cost of an electronic device is reduced. Besides, by using the EL display device in which the operation performance and reliability are improved, it becomes possible to produce an applied product (electronic device) having excellent picture quality and durability (high reliability).

We claim:

1. An EL display device comprising:
a substrate;
a thin film transistor over the substrate;
a first electrode electrically connected to the thin film transistor;
an EL layer including a polymer material, over the first electrode; and
a second electrode including Mg and Ag, over the EL layer,
wherein an edge of the EL layer is covered with the second electrode.

2. An EL display device according to claim 1, wherein the EL display device is incorporated into an electronic device selected from the group consisting of a video camera, a digital camera, a goggle type display, a car navigation system, a portable information terminal, and an image playback device.

3. An EL display device according to claim 1, wherein the EL layer is formed by a relief printing method.

4. An EL display device comprising:
a substrate;
a thin film transistor over the substrate;
a first electrode electrically connected to the thin film transistor;
an EL layer including a polymer material, over the first electrode;
a second electrode including Mg and Ag, over the EL layer; and
a third electrode over the second electrode,
wherein an edge of the EL layer is covered with the second electrode.

5. An EL device according to claim 4, wherein the third electrode includes Al.

6. An EL display device according to claim 4, wherein the EL display device is incorporated into an electronic device selected from the group consisting of a video camera, a digital camera, a goggle type display, a car navigation system, a portable information terminal, and an image playback device.

7. An EL display device according to claim 4, wherein the EL layer is formed by a relief printing method.

8. An EL display device comprising:
a substrate;
a thin film transistor over the substrate;
an interlayer insulating film over the thin film transistor;
an insulating film over the interlayer insulating film;
a first electrode electrically connected to the thin film transistor, formed over the insulating film;
an EL layer including a polymer material, over the first electrode; and
a second electrode including Mg and Ag, over the EL layer,
wherein an edge of the EL layer is covered with the second electrode.

9. An EL display device according to claim 8, wherein the insulating includes at least one element of B, C and N and at least one element of Al, Si and P.

10. An EL display device according to claim 8, wherein the EL display device is incorporated into an electronic device selected from the group consisting of a video camera, a digital camera, a goggle type display, a car navigation system, a portable information terminal, and an image playback device.

11. An EL display device according to claim 8, wherein the EL layer is formed by a relief printing method.

12. An EL display device comprising:
a substrate;
a thin film transistor including a semiconductor layer and a gate electrode adjacent to the semiconductor layer with a gate insulating film interposed therebetween, over the substrate;
a first electrode electrically connected to the thin film transistor;
an EL layer including a polymer material, over the first electrode; and
a second electrode including Mg and Ag, over the EL electrode,
wherein an edge of the EL layer is covered with the second electrode, and
wherein the semiconductor layer includes an LDD region overlapped with the gate electrode at least partly.

13. An EL display device according to claim 12, wherein the EL display device is incorporated into an electronic device selected from the group consisting of a video camera, a digital camera, a goggle type display, a car navigation system, a portable information terminal, and an image playback device.

14. An EL display device according to claim 12, wherein the EL layer is formed by a relief printing method.

15. An EL display device comprising:
a substrate;
a first thin film transistor over the substrate;
a second thin film transistor for switching the first thin film transistor, over the substrate;
a first electrode electrically connected to the first thin film transistor;
an EL layer including a polymer material, over the first electrode; and
a second electrode including Mg and Ag, over the EL layer,
wherein an edge of the EL layer is covered with the second electrode, and
wherein a semiconductor layer of the second thin film transistor includes two or more channel formation regions connected in series.

16. An EL display device according to claim 15, wherein the EL display device is incorporated into an electronic device selected from the group consisting of a video camera, a digital camera, a goggle type display, a car navigation system, a portable information terminal, and an image playback device.

17. An EL display device according to claim 15, wherein the EL layer is formed by a relief printing method.

* * * * *